(12) United States Patent
Bezama et al.

(10) Patent No.: US 7,190,580 B2
(45) Date of Patent: Mar. 13, 2007

(54) APPARATUS AND METHODS FOR MICROCHANNEL COOLING OF SEMICONDUCTOR INTEGRATED CIRCUIT PACKAGES

(75) Inventors: Raschid Jose Bezama, Mahopac, NY (US); Evan George Colgan, Chestnut Ridge, NY (US); John Harold Magerlein, Yorktown Heights, NY (US); Roger Ray Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 10/883,534

(22) Filed: Jul. 1, 2004

(65) Prior Publication Data

US 2006/0002087 A1 Jan. 5, 2006

(51) Int. Cl.
*H05K 7/20* (2006.01)

(52) U.S. Cl. ............... 361/699; 257/714; 165/80.4; 174/15.1

(58) Field of Classification Search ........ 361/698–700, 361/704, 711; 257/714, 715; 174/15.1, 174/15.3; 165/80.4, 104.33
See application file for complete search history.

(56) References Cited

U.S. PATENT DOCUMENTS

| | | | |
|---|---|---|---|
| 4,573,067 A | 2/1986 | Tuckerman et al. | 357/82 |
| 5,099,311 A | 3/1992 | Bonde et al. | 357/82 |
| 5,218,515 A | 6/1993 | Bernhardt | 361/385 |
| 5,388,635 A | 2/1995 | Gruber et al. | 165/80.4 |
| 5,453,641 A * | 9/1995 | Mundinger et al. | 257/714 |
| 5,801,442 A | 9/1998 | Hamilton et al. | 257/714 |
| 5,998,240 A | 12/1999 | Hamilton et al. | 438/122 |
| 6,101,715 A | 8/2000 | Fuesser et al. | 29/890.03 |
| 6,253,835 B1 | 7/2001 | Chu et al. | 165/80.4 |
| 6,301,109 B1 | 10/2001 | Chu et al. | 361/690 |
| 6,400,012 B1 * | 6/2002 | Miller et al. | 257/712 |
| 6,903,929 B2 * | 6/2005 | Prasher et al. | 361/699 |
| 6,904,966 B2 * | 6/2005 | Philpott et al. | 165/185 |
| 6,935,411 B2 * | 8/2005 | Valenzuela | 165/80.4 |
| 6,942,018 B2 * | 9/2005 | Goodson et al. | 165/80.4 |
| 2004/0112571 A1 * | 6/2004 | Kenny et al. | 165/80.3 |
| 2005/0200001 A1 * | 9/2005 | Joshi et al. | 257/712 |

* cited by examiner

*Primary Examiner*—Boris Chervinsky
(74) *Attorney, Agent, or Firm*—F. Chau & Associates LLC; Frank V. DeRosa

(57) ABSTRACT

Apparatus and methods are provided for microchannel cooling of electronic devices such as IC chips, which enable efficient and low operating pressure microchannel cooling of high power density electronic devices. Apparatus for microchannel cooling include integrated microchannel heat sink devices and fluid distribution manifold structures that are designed to provide uniform flow and distribution of coolant fluid and minimize pressure drops along coolant flow paths.

29 Claims, 13 Drawing Sheets

US 7,190,580 B2

APPARATUS AND METHODS FOR MICROCHANNEL COOLING OF SEMICONDUCTOR INTEGRATED CIRCUIT PACKAGES

This invention was made with Government support under Contract No. H98230-04-C-0920 awarded by the Maryland Procurement Office. The Government has certain rights to the invention.

TECHNICAL FIELD OF THE INVENTION

The present invention relates generally to apparatus and methods for cooling electronic devices. More specifically, the present invention relates to microchannel cooling apparatus and methods which provide improved fluid distribution and flow mechanisms for efficient cooling of semiconductor integrated circuit (IC) chip packages.

BACKGROUND

In the design and manufacture of semiconductor IC (integrated circuit) chip packages and modules, it is imperative to implement mechanisms that can effectively remove heat generated by IC chip devices (such as microprocessors) to ensure continued reliable operation of such devices. Indeed, heat removal is particularly important for computer processor chips that are disposed in SCM (single chip modules) or MCMs (multichip modules), for example, which can generate significant amounts of heat. The ability to efficiently remove heat becomes increasing problematic as chip geometries are scaled down and operating speeds are increased, resulting in increased power density. Although IC chip modules are being continually designed to operate at higher clock frequencies, increased system performance is becoming limited primarily by the ability to effectively remove heat from such IC chip modules.

There are various heat removal techniques that have been developed for cooling semiconductor IC packages/modules and other electronic devices. For example, microchannel cooling apparatus and methods have been proposed for cooling electronic devices such as IC chips, MCMs, diode laser arrays, and other electro-optic devices under conditions of increased heat flux (power/unit area) or high power densities (e.g., ~800 W/cm$^2$).

FIGS. 1A and 1B are schematic diagrams that illustrate a conventional microchannel cooling apparatus, such as described in U.S. Pat. No. 4,573,067, wherein FIG. 1B illustrates a cross-section view of FIG. 1A along the line 1B. As shown, a semiconductor chip (10) includes circuits that are formed in a front surface region (11) of the semiconductor chip (10). A rear surface of the chip (10) is processed to form a recessed region (12) and a plurality of parallel, microscopic heat conducting fins (14) rising from the recessed region (12), which define a plurality of channels (13). A transparent cover (15) engages the surface of chip (10) and the tops of the fins (14) thereby defining a chamber for the flow of a coolant through the channels (13) between the input and output ports (16) and (17) in the transparent cover (15), wherein heat removal is achieved by thermal contact between the fins (14) and the coolant fluid that flows through the channels (13).

There are a number of disadvantages associated with the cooling apparatus depicted in FIGS. 1A and 1B. For instance, such design results in significant pressure drops and non-uniform flow distribution due to, e.g., the use of one heat exchanger zone (with long channel length) between the input port (16) and the output port (17), and having an input port (16) and output port (17) with a cross sectional area that is smaller than the total microchannel cross sectional area. Furthermore, the process of forming the fins (14) and channels (13) directly in the non-active surface of the IC chip (10) can result in reduced yield for the chips (10), which is not desirable especially for expensive chips such as microprocessors. Indeed, if the microchannel cooler fails or leaks, the chip, which is much more expensive than the cooler in the case of a high performance processor, is lost along with the microchannel cooler.

FIGS. 2A~2C schematically illustrate another conventional microchannel cooling apparatus, such as described in U.S. Pat. No. 5,998,240. FIG. 2A depicts a silicon chip (20) having a region containing a plurality of microchannels (21) formed therein, which comprise a plurality of close-ended slots or grooves of generally rectangular cross-section. As depicted in FIG. 2B, the chip (20) sits on a ceramic frame (22) that includes three generally rectangular coolant manifolds (23), (24) and (25). The center manifold (24) comprises a coolant input manifold having a coolant inlet port (27) formed at one end, while the two outer manifolds (23) and (25) comprise output manifolds and include coolant outlet ports (26) and (28) at the opposite end from the inlet port (27). The die (20) is oriented with respect to the ceramic substrate (22) such that the microchannels (21) are orthogonal to the manifolds (23), (24) and (25). As depicted in FIG. 2C, the chip (20) and the ceramic substrate (22) are mounted on a ground plane (29) having two coolant output ducts (29a) and a single coolant input duct (29a), wherein the liquid coolant flow direction is shown by the arrows.

There are a number of disadvantages with the conventional microchannel cooling apparatus depicted in FIGS. 2A~2C. For instance, if the substrate (22) comprising the manifold channels (23, 24, 25) was fabricated using Silicon, the substrate would be weak and likely break during fabrication due to the formation of the multiple channels through the substrate with sharp-edge corners. Moreover, such design results in significant pressure drops and non-uniform flow distribution, which result from (i) the input and output ports (26, 27, 28) having a smaller cross sectional area than the total microchannel cross sectional area, (ii) the manifolds (23, 24, 25) having grooves which are of constant cross section feeding the microchannels (21) and (iii) having the microchannels (21) continue below the inlet manifold groove (24) when two outlet manifold grooves (23, 25) are used.

FIGS. 3A and 3B are schematic diagrams illustrating other conventional microchannel cooling structures, such as described in U.S. Pat. No. 5,218,515. FIG. 3A illustrates a cut-away perspective view of an integrated circuit module (30), which includes an IC chip (31) having solder bump bonding sites (32) along a front (active) surface (31a) of the chip (31). A back (non-active) surface (31b) of the chip (31) is thermally bonded to a microchannel structure (33). A plurality of microchannels (33a) are formed in the microchannel structure (33). A cover manifold (34) is bonded to the microchannel structure (33). Input and output coolant delivery channels (34a) and (34b) are cut or formed in the cover manifold (34) as illustrated.

FIG. 3B illustrates a coolant supply manifold (35) which is used to supply coolant for a multi-chip module (MCM) package comprising an array of the microchannel cooled IC modules (30) mounted face down on a common substrate or circuit board. The coolant supply manifold (35) includes a plurality of coolant supply channels (e.g. (36), (37), (38) and (39)), wherein channels (36) and (38) are higher pressure channels while channels (37) and (39) are lower pressure channels. The manifold (35) is adapted for placement over a printed wiring card so that, e.g., the openings (36a) and (37a) in respective coolant supply channels (36) and (37) mate with the openings (34a) and (34b) in the individual integrated circuit modules (30) on the circuit board. Elastomer seals are used to couple the coolant supply manifold (35) with the integrated circuit modules (30).

There are disadvantages associated with the microchannel cooling apparatus depicted in FIGS. 3A and 3B. For instance, the microchannel coolers (30) are formed with one heat exchanger zone (between the input and output manifold channels (34a, 34b)), which can result in significant pressure drops of fluid flow along the microchannels (33a). Moreover, if a cover manifold (34) was formed with multiple coolant delivery channels (e.g., 34a) for multiple heat exchanger zones to reduce the pressure drop, the cover manifold (34) would be fragile and likely to break during fabrication, thereby reducing manufacturing yield.

Furthermore, the coolant supply manifold (35) design of FIG. 3B can result in large pressure drops and significant non-uniform flow distribution due to the channels, which feed a given column of four microchannel inlets, having a constant cross-sectional area. For instance, as depicted in FIG. 3B, the supply channel (36) feeds coolant fluid to four coolant delivery manifolds (34a) of module (30) (FIG. 3A) via the four openings (36a). Assume V, $\Delta P$, and Q are the velocity, differential pressure and total flow in the last manifold segment, i.e., between the bottom two microchannel inlets, then the segment above will desirably have velocity 2V, and total flow 2Q. This higher velocity will result in a segment pressure drop equal to $\sim 2\Delta P$ if the flow is laminar and $\sim 4\Delta P$ if the flow is turbulent (given the linear dependency between flow and pressure drop when the flow is laminar, but quadratic dependency when the flow is turbulent). Thus, for a manifold channel with constant cross-section feeding four microchannel inlets, we can expect a total manifold channel pressure drop of $\sim 10 \Delta P$ if the flow is laminar, and $\sim 30 \Delta P$ if the flow is turbulent. This large pressure drop will induce flow variations within the different microfin sections that can not be compensated with a return line, also with constant cross-section but with reverse orientation relative to the inlet line. Since the manifold channel has to carry significantly larger water flow than a given microchannel, both velocity and cross-section will be higher, therefore, it is easy to expect (or difficult to avoid) having a 10× increase in the Reynolds number between these two sections. For low cooling capability, like less than 50 W/cm$^2$, the water flow requirements are low, and it is possible to have both manifold channels and microchannels with laminar flow regimes, but at high flows this is not possible since the microchannels will require flow regimes with Reynolds number in the 100–200 range, then, the flow regime in the manifold channel will not be laminar.

SUMMARY OF THE INVENTION

Exemplary embodiments of the invention generally include apparatus and methods for cooling of electronic devices and, in particular, apparatus and methods for microchannel cooling of IC (integrated circuit) chips mounted face down on a package substrate. More specifically, exemplary embodiments of the invention include microchannel cooling apparatus, including integrated microchannel heat sink devices and fluid distribution manifold structures, which are designed to provide uniform flow and distribution of coolant fluid and minimize pressure drops along coolant flow paths to thereby enable efficient and low operating pressure microchannel cooling of high power density electronic devices.

For example, in one exemplary embodiment, an apparatus for cooling an electronic device comprises an integrated microchannel cooler device comprising a manifold plate and microchannel plate that are thermally bonded to each other. The manifold plate comprises a plurality of alternating input and output manifolds that extend in a same direction along the manifold plate, wherein at least one heat exchanger zone is defined between each adjacent input and output manifold, and wherein one or more of the manifolds extends in a zig-zag pattern. Each manifold comprises a manifold channel formed in a first surface of the manifold plate, and a plurality of vias that form openings in a second surface of the manifold plate opposite the first surface, which extend through the manifold plate to a plurality of locations along the manifold channel. The fluid vias are formed with rounded corners (e.g., the fluid vias are circular). The microchannel plate comprises a pattern of microfins that define microchannels formed in a first surface of the microchannel plate and the microchannels extend in a same direction along the microchannel plate. The first surface of the manifold plate is coupled to the first surface of the microchannel plate such that the microchannels are positioned to provide fluid flow between adjacent manifolds.

In another exemplary embodiment, the manifold channels are designed with a variable cross-sectional area between the fluid vias along the length of the manifold channel. More specifically, for a manifold having a zig-zag pattern, the fluid vias are arranged in the zig-zag pattern, and the manifold channel comprises a plurality of channel segments arranged in the zig zag pattern, wherein each channel segment is formed between two fluid vias, and wherein each channel segment has a width that tapers down away from the two fluid vias along the channel segment.

In other exemplary embodiments of the invention, each manifold channel has a cross-sectional area at any point along the channel that is within about 25% of, or more preferably at least approximately equal, to a total cross-sectional area of all microchannels that will receive coolant fluid from the manifold channel or that will supply coolant fluid to the manifold channel, and/or the fluid vias for each manifold have a total cross-sectional area that is within about 25% of, or more preferably at least approximately equal to, a total cross-sectional area of all microchannels that receive coolant fluid supplied through the fluid vias or that supply coolant fluid which is output from the fluid vias.

In yet another exemplary embodiment of the invention, the microfin pattern of the microchannel plate comprises a plurality of recessed regions in which the microfin pattern is discontinued, wherein each recessed region is aligned to a corresponding manifold channel and comprises a pattern substantially similar to the corresponding manifold channel pattern. The end portions of the microfins adjacent the recessed regions can be rounded or tapered. In other embodiments of the invention, the microfins that are formed between adjacent recessed regions of the microchannel define a plurality of microchannels that extend continuously between the adjacent recessed regions, or all or a portion of the microfins formed between adjacent recessed regions define a plurality of microchannels that extend in a staggered or interrupted pattern between the adjacent recessed regions.

These and other exemplary embodiments, aspects, features, and advantages of the present invention will become apparent from the following detailed description of the

DETAILED DESCRIPTION OF EXEMPLARY EMBODIMENTS

Figure 1A:
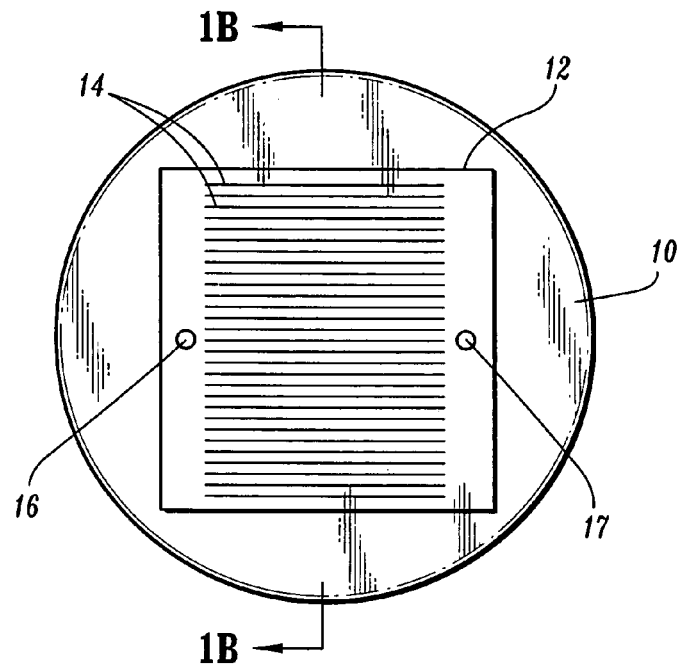
FIGS. 1A and 1B are schematic diagrams that illustrate a conventional apparatus for microchannel cooling an IC chip.
Figure 1B:
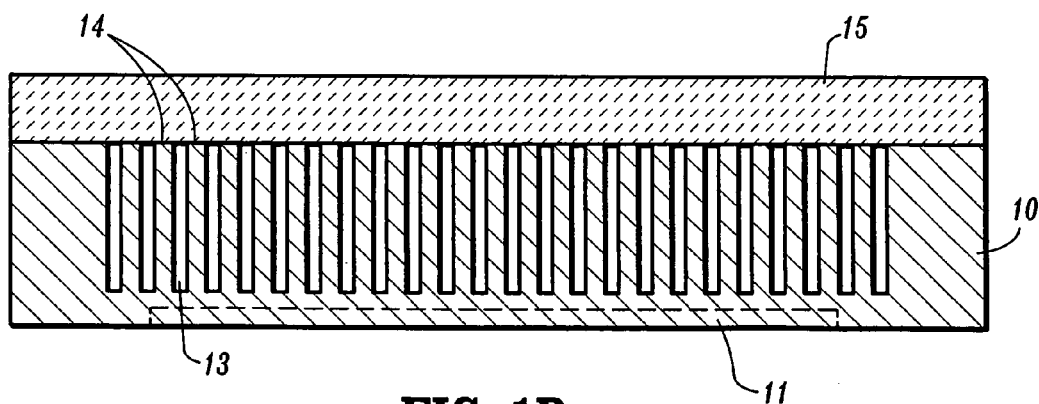
Figure 2A:
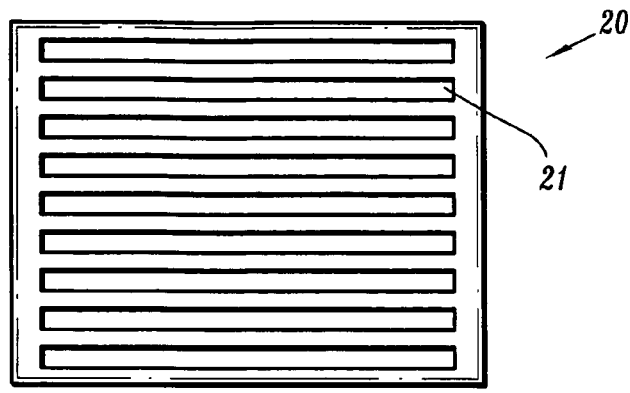
FIGS. 2A–2C are schematic diagrams that illustrate another conventional apparatus for microchannel cooling an IC chip.
Figure 2B:
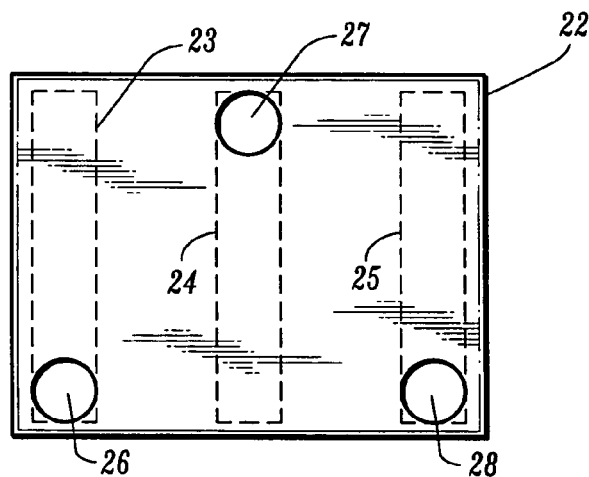
Figure 2C:
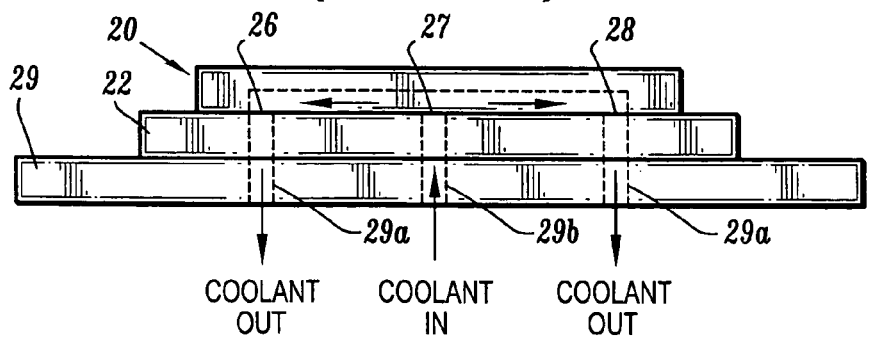
Figure 3A:
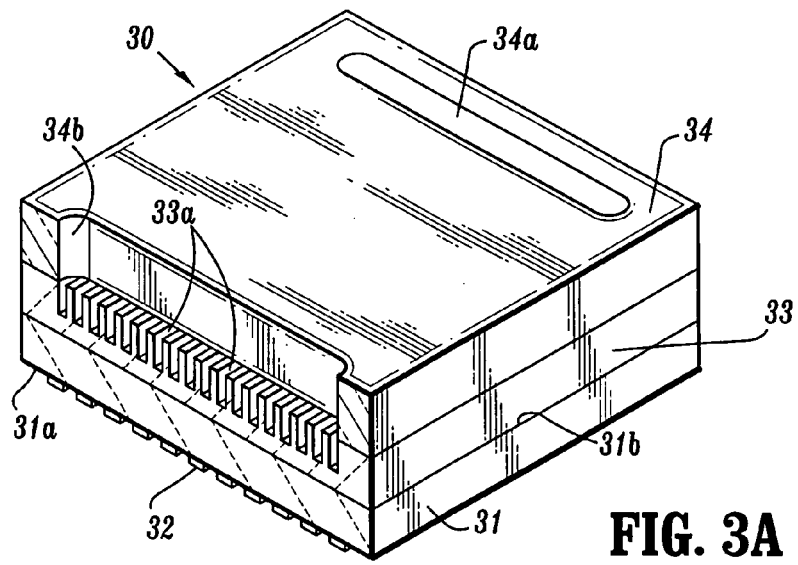
FIGS. 3A and 3B are schematic diagrams that illustrate conventional apparatus for microchannel cooling IC chips for an MCM (multi-chip module).
Figure 3B:
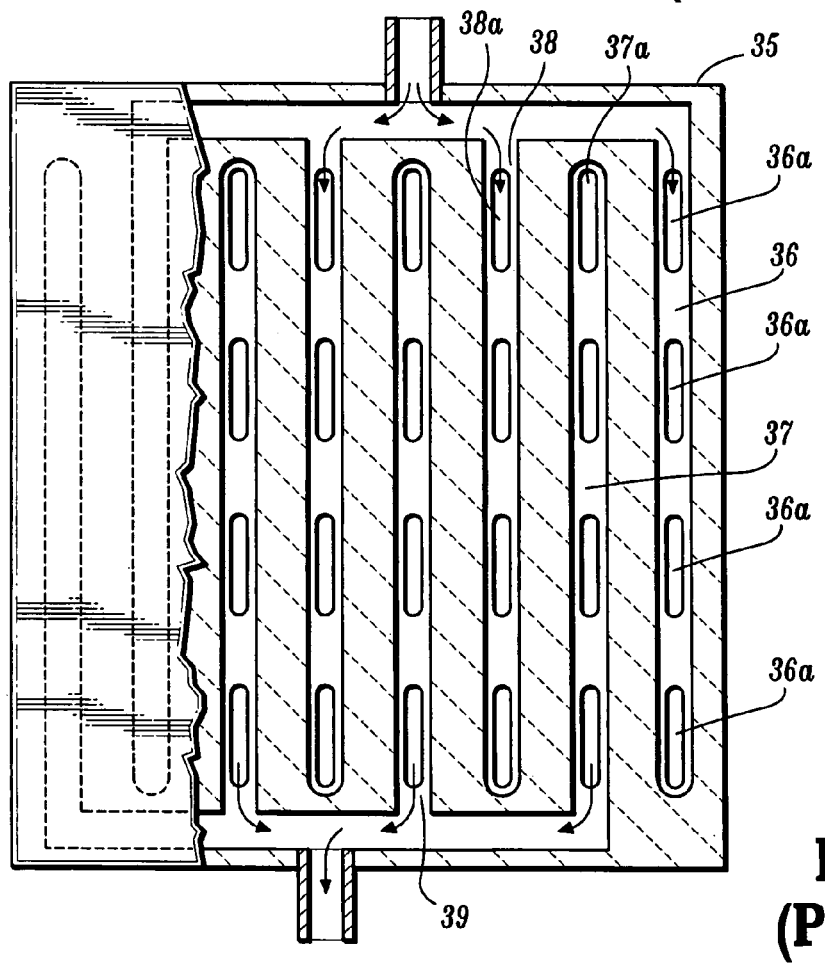

Exemplary embodiments of the invention as described herein generally include apparatus and methods for cooling of electronic devices and, in particular, apparatus and methods for microchannel cooling of IC (integrated circuit) chips mounted face down on a package substrate. In general, an apparatus for microchannel cooling an electronic device according to one exemplary embodiment of the invention comprises an integrated microchannel cooler device (or microchannel heat sink) that is thermally bonded to a non-active surface of an IC chip mounted face down on a package substrate, and a fluid distribution manifold device, which is removably coupled to the integrated microchannel device via a mechanically compliant gasket, to deliver coolant fluid to/from the integrated microchannel device. As explained below, microchannel cooling apparatus and methods according to various exemplary embodiments of the invention implement fluid distribution and flow mechanisms which foster uniform flow of coolant fluid and which prevent/mitigate reduction of pressure of the coolant fluid along the coolant flow paths, to thereby provide high cooling rate capability and efficiency for cooling electronic devices such as semiconductor integrated circuit (IC) chip packages/modules.

More specifically, exemplary embodiments of the invention include various frameworks/architectures for integrated microchannel cooler devices that can be thermally bonded to IC chips, which are designed to optimize the distribution and flow of coolant fluid for efficient heat removal. For example, in one exemplary embodiment of the invention, an integrated microchannel cooler device comprises a microchannel plate having a plurality of microchannels defined by microfins formed in one surface of the microchannel plate, and a manifold plate (or manifold cover), which is bonded to the microchannel plate, having a plurality of coolant supply/return manifolds. In another exemplary embodiment of the invention, an integrated microchannel cooler device comprises a single plate that is constructed with both microchannels and supply/return manifolds structures. In all such embodiments, an integrated microchannel cooler device includes supply/return manifolds and microchannels/microfins that are structured, patterned, dimensioned and/or arranged in a manner that minimizes pressure drop and increases uniformity of fluid flow and distribution along coolant flow paths.

An integrated microchannel cooler device according to one exemplary embodiment of the invention will now be discussed in detail with reference to the exemplary embodiments of FIGS. 4A~4D and FIGS. 5A~5B, for example. In particular, FIGS. 4A~4D are schematic diagrams illustrating a manifold plate (40) according to an exemplary embodiment of the invention, which can be bonded to a corresponding microchannel plate (50) as depicted in the exemplary schematic diagrams of FIGS. 5A–5B, to form an integrated microchannel cooler device.

More specifically, with initial reference to the illustrative views of FIGS. 4A~4D, an exemplary manifold plate (40) comprises a planar substrate (41) having a plurality of fluid manifolds (M1~M7) (or denoted generally, Mi) formed therein. Each fluid manifold (M1~M7) comprises a corresponding manifold channel (C1~C7) (or more generally, Ci) formed in one surface (S2) of the substrate (41) and a corresponding pattern/series of fluid vias (V1~V7) (or more generally, Vi) having a plurality of fluid vias (v) that form openings which extend from a surface (S1) (which is opposite the surface (S2)) to various points along the corresponding manifold channels (C1~C7). As explained below, the fluid manifolds (Mi) are structured, patterned, dimensioned and/or arranged in a manner that enables the manifold plate (40) to provide a uniform flow distribution and reduce overall system pressure drop, as well as maintain the structural integrity of the manifold plate to prevent breakage during manufacturing.

Figure 4A:
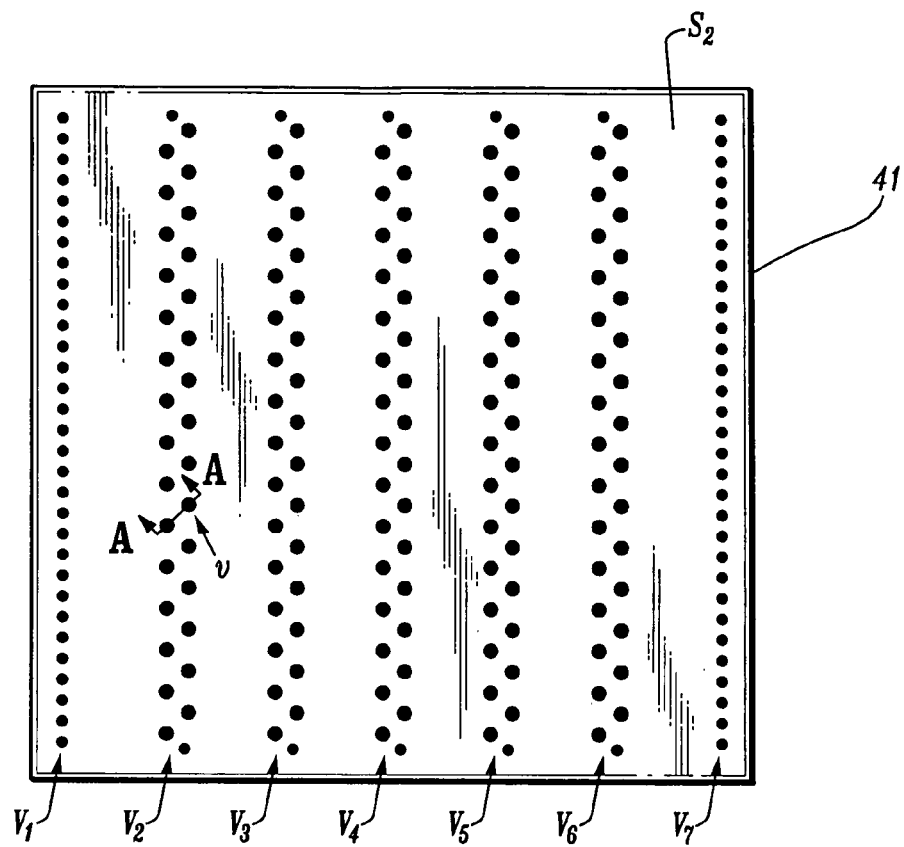
FIGS. 4A–4D are exemplary schematic diagrams that illustrate a manifold plate and method for fabricating the manifold plate, according to an exemplary embodiment of the invention.
Figure 4B:
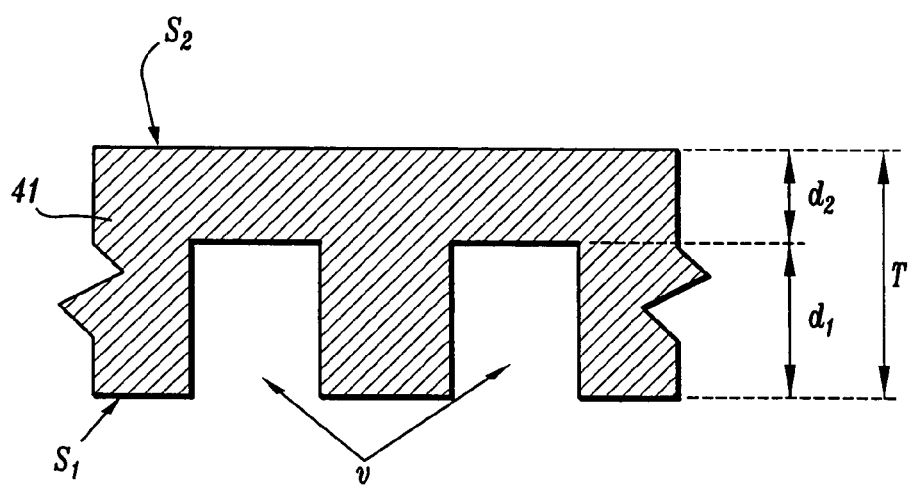

More specifically, FIG. 4A is a schematic plan view of the manifold plate (40) at one stage of production in which the plurality of patterns/series of fluid vias (V1~V7) are formed in one surface (S1) of the planar substrate (41), which is the bottom surface of the substrate (41) in the illustrative view. In other words, FIG. 4A depicts the patterns of vias (V1~V7) as viewed from a top surface (S2) of the substrate (41) which is opposite the bottom surface (SI) in which the vias (v) are formed. FIG. 4B is a schematic cross-sectional view of a portion of the substrate (41) along line AA of FIG. 4A, which illustrates the substrate (41) having a thickness (T) and the vias (v) being formed to a depth (d1) below the substrate surface (S1) (i.e., the vias are not formed entirely through the substrate (40)). In one exemplary embodiment of the invention in which the substrate (41) is formed of silicon (Si), the fluid vias can be formed using a deep Si etching method to etch the fluid vias partially through the substrate (41). In particular, in one exemplary embodiment, for a typical silicon wafer substrate having a thickness, T, of 0.75 mm, the fluid vias (v) can be formed to a depth of $d_1$=0.50 mm. Further, the fluid vias can be circular holes with a diameter of about 450 microns. It is to be noted that although circular holes are shown in the exemplary embodiment, the fluid vias may be formed with other shapes, preferably with rounded corners (as compared to shapes with sharp corners that act as stress concentration sites which can increase the possibility of breakage of the components during manufacturing).

As depicted in the exemplary embodiment of FIG. 4A, via patterns (V1) and (V7) comprise a series of circular openings that are arranged in a linear pattern, and the via patterns (V2)~(V6) each comprise a series of circular openings arranged in a zig-zag pattern. As explained below, a fabrication method in which the manifolds are constructed by forming a series of circular openings in a zig-zag pattern reduces the potential of wafer (or substrate) breakage during manufacturing of the manifold plate, when forming multiple manifolds to define multiple heat exchanger zones.

Figure 4C:
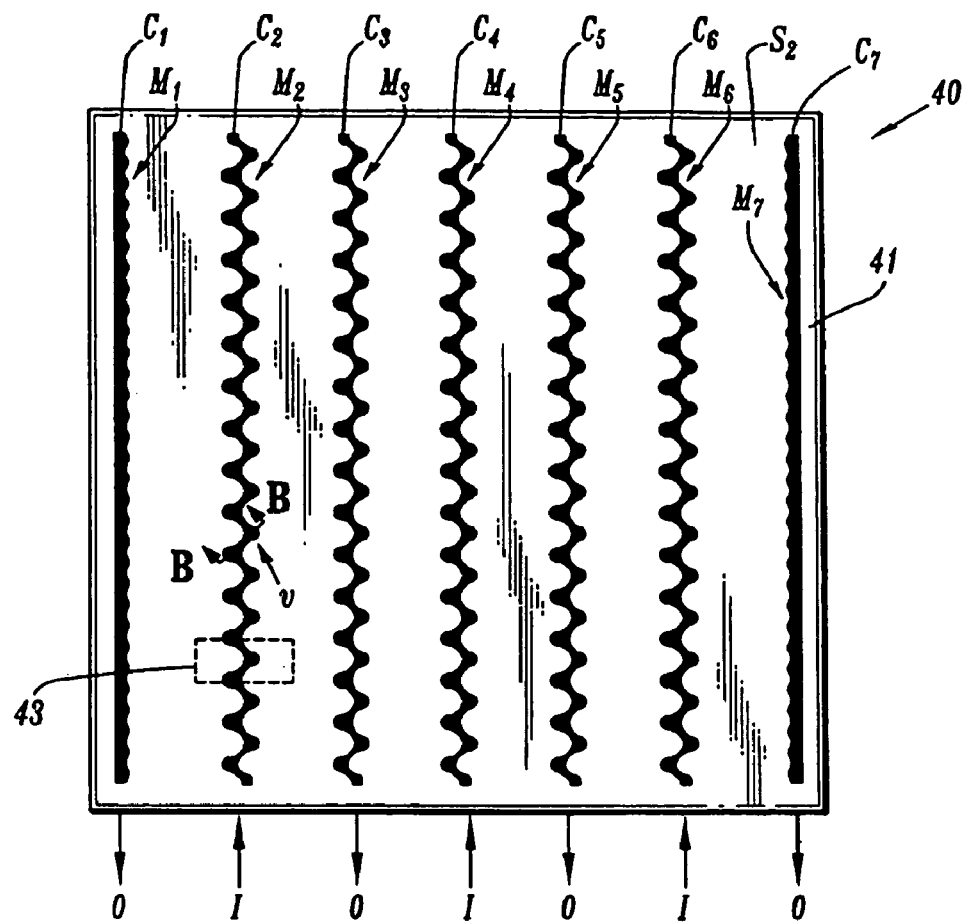
Figure 4D:
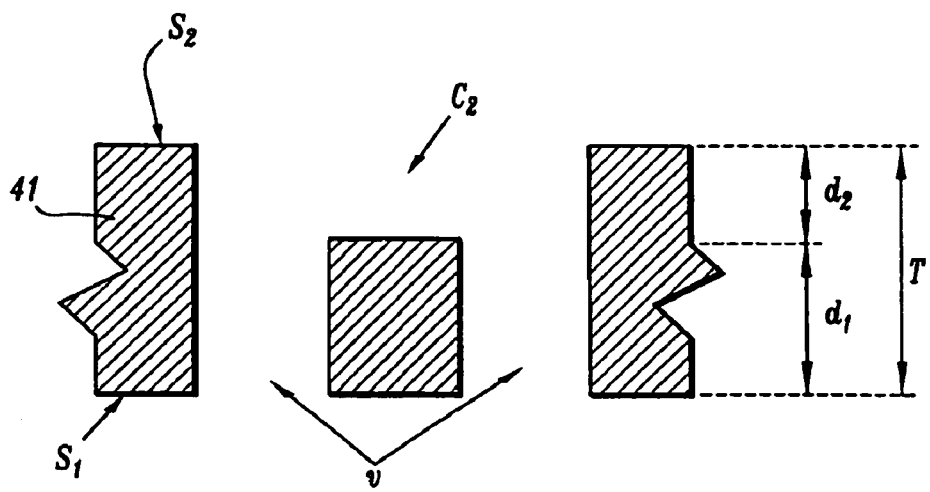

Each pattern/series of fluid vias (Vi) comprises a plurality of openings that serve as fluid inlets/outlets to a corresponding input/output manifold channel (Ci) that is formed on the surface (S2) of the substrate (41) opposite the surface (S1) in which the patterns of fluid vias (Vi) are formed. For example, FIG. 4C illustrates a schematic plan view of the exemplary manifold plate (40) at another stage of production in which manifold channels (C1~C7) are formed in the surface (S2) of the substrate (41), wherein each manifold channel (C1~C7) comprises a continuous cavity that is patterned and recessed to a depth that is sufficient to connect to each fluid via (v) of a corresponding pattern of fluid vias (V1~V7). More specifically, FIG. 4D is a schematic cross-sectional view of a portion of the substrate (41) along line BB of FIG. 4C, which illustrates a channel segment of the manifold channel C2, which is formed between two vias (v) by etching a recess between the vias (v) in the substrate (41) to a sufficient depth, $d_2$, below the surface (S2) of the substrate (41) to connect with the fluid vias (v). Continuing with the exemplary embodiment described with respect to FIG. 4B wherein the substrate (41) of the manifold plate (40) is formed of silicon, the manifold channels (Ci) can be formed using a deep Si etching process to etch the recesses to a depth of $d_2$=0.25 mm.

Figure 6:
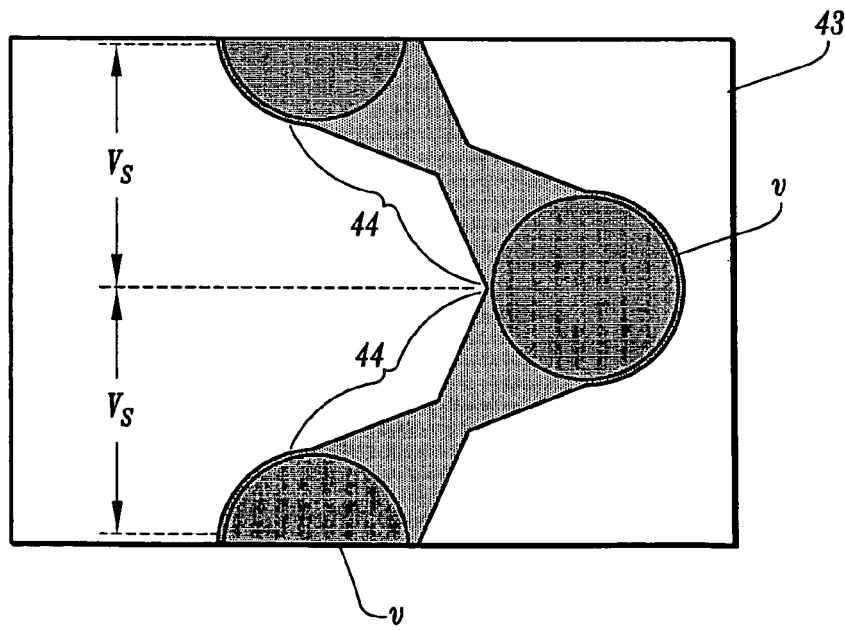
FIG. 6 is schematic detailed illustration of a portion of a manifold structure according to an exemplary embodiment of the invention.
Figure 9A:
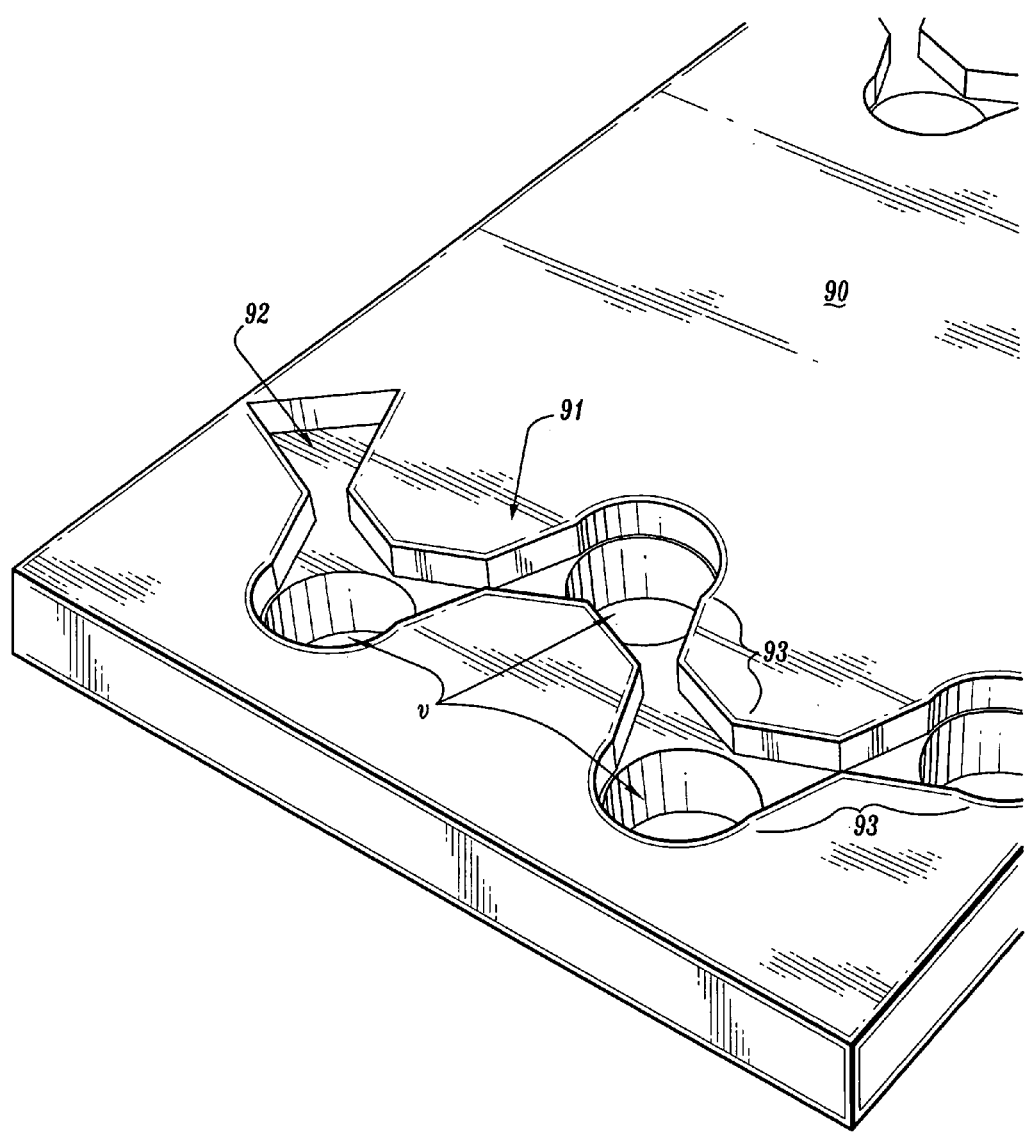
FIG. 9A~9C are schematic diagrams of perspective views that illustrate an apparatus for microchannel cooling a semiconductor chip according to another exemplary embodiment of the invention.

Furthermore, in an exemplary embodiment of the invention, the manifolds (Mi) comprise manifold channels (Ci) that are formed having a variable cross-sectional area. For instance, FIG. 6 is schematic detailed view of the manifold structure for a portion of the fluid manifold (M2) in region (43) as depicted in FIG. 4C. In the exemplary view of FIG. 6, the channel segments (44) between the fluid vias (v) form tapered recesses which taper down away from the fluid vias (v) to decrease the channel cross-sectional area. Details of the exemplary manifold structure are further depicted in FIG. 9A, which depicts a three-dimensional perspective view of a manifold channel (91) having a zig-zag pattern, which is formed in a manifold plate (90). In particular, FIG. 9A depicts a plurality of fluid vias (v) that form openings to a manifold channel (92), wherein the manifold channel (92) is patterned such that channel segments (93) between two fluid vias (v) form tapered recesses.

Advantageously, the tapered manifold channel widths help to minimize dynamic pressure drop along the channels by maintaining the flow velocity of the coolant fluid relatively constant. More specifically, varying the cross-sectional area of the manifold channels (Ci) provides a means for reducing dynamic pressure drop along the manifold channels (Ci) and thereby enabling the manifold channels (Ci) to uniformly distribute the flow of coolant fluid to/from microchannel inlet/outlets that are disposed along the manifold channels (Ci).

Figure 5A:
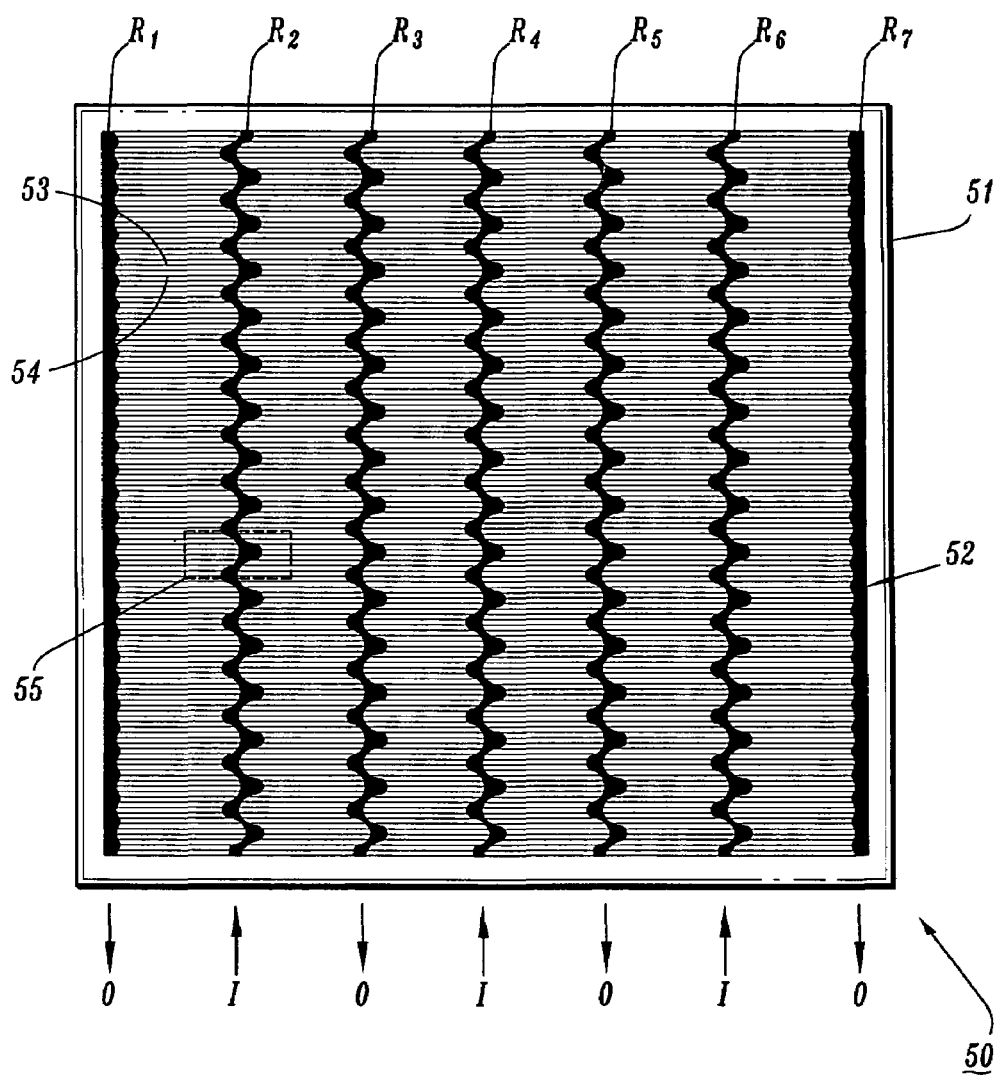
FIGS. 5A~5B are schematic diagrams that illustrate a microchannel plate according to an exemplary embodiment of the invention, which can be joined with the exemplary manifold plate of FIGS. 4A–4D for constructing an integrated microchannel cooler device according to one exemplary embodiment of the invention.
Figure 5B:
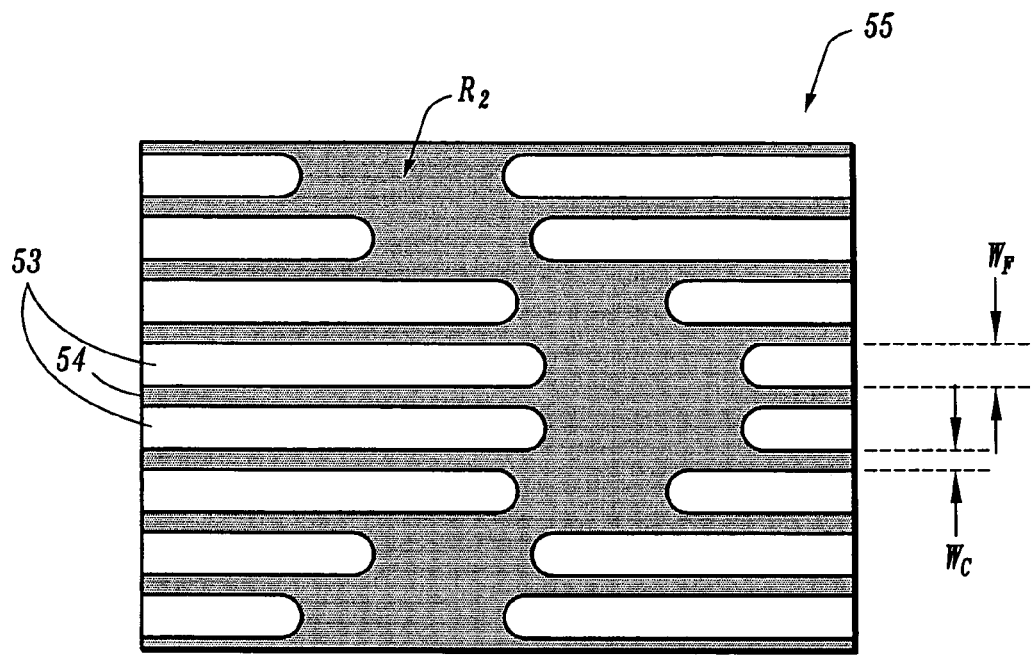

FIGS. 5A and 5B are schematic diagrams illustrating a microchannel plate according to an exemplary embodiment of the invention. More specifically, FIG. 5A is a schematic plan view of a microchannel plate (50) which is compatible for use with the exemplary manifold plate (40) of FIG. 4C, for example. In FIG. 5A, the microchannel plate (50) comprises a substrate (51) (e.g., Si substrate). The substrate (51) comprises a region (52) that is etched (using deep Si etching or other suitable techniques known to those of ordinary skill in the art) to form a plurality of parallel thermal microfins (53) which define microchannels (54) (see FIG. 5B) that extend in the same direction across the region (52). The microchannels (54) comprise a plurality of open-ended slots or grooves of generally rectangular cross-section.

In the exemplary embodiment of FIG. 5A, the microfins (53) are not continuous across the region (52), but are interrupted/discontinuous in such as way as to form recessed regions (R1~R7) which correspond to, and are aligned with, the manifold channels C1~C7 (FIG. 4C) when the manifold plate (40) is bonded to the microchannel plate (50) to form an integrated microchannel cooler device. By way of example, FIG. 5B is a detailed illustration of a portion (55) of the microchannel plate (50) of FIG. 5A, wherein the microfins (53) are discontinuous across the recess region (R2) which corresponds to (aligned with) the manifold channel (M2) of manifold plate (40) (e.g., portion (43) as depicted in FIG. 6). The recessed regions (R1~R7) act as manifolds in conjunction with the corresponding manifold channels (C1~C7) of the manifold plate (40) to increase the area available for the distribution of fluid that flows from the fluid vias (v) to the microchannel (for inlet manifolds) and for the distribution of fluid that flows from the microchannels to the fluid vias (for outlet manifolds). For instance, the portion (43) of the manifold plate depicted in FIG. 6 illustrates a portion of a manifold channel that corresponds to, and can be aligned with, the portion of the recessed region R2 depicted in FIG. 5B. In this regard, the combined area of the manifold channel and recessed regions provides an increased area for fluid flow and distribution.

Moreover, as depicted in FIG. 6, for example, the channel segments (44) of the manifold channel between the fluid vias (v) have varying cross-sectional areas for purposes of reducing pressure drop. More specifically, as depicted in the exemplary embodiments of FIGS. 5B and 6, the channel segments (44) between the input fluid vias (v) of manifold channel (C2) and corresponding portions of the recessed regions (R2) are tapered down away from input fluid vias (v), so as to reduce the cross-sectional area along the coolant path. This results in reduced pressure drop and maintaining the velocity of fluid flow constant, so as to uniformly feed coolant into the microchannels that are disposed along the channel segments.

Furthermore, with the exemplary embodiment depicted in FIG. 5B, the end portion of the microfins (53) along the recessed region (e.g., R2 as shown in FIG. 5B) can be formed with rounded or tapered edges to provide a further reduction in overall system pressure drop. Indeed, the rounded or tapered edges of the microfins (53) results in microchannels (54) having rounded inlet/outlet corners, which reduces the flow resistance by smoothing the incoming/outgoing flow stream.

In one exemplary embodiment of the invention, assume the microfins (53) are formed having a width, $W_F$=90 micron, and define the microchannels (54) having a channel width $W_c$=60 micron and channel depth of 250 micron deep. Further assume that a vertical spacing (Vs) between two adjacent fluid vias (v) (as indicated in FIG. 6) is 0.6 mm, and each via (v) provides coolant to/from a series of microchannels to both the left and right side of the adjacent manifold channel segments (44). Therefore, in this exemplary embodiment, the total cross-sectional area of the microchannels that a single fluid via (v) provides coolant to/from is 1.2 mm×0.25 mm×60%=0.18 mm² (wherein 1.2mm=2Vs and 0.25 mm is the depth of the microchannels. Further assuming (as mentioned previously) that diameter of the fluid via (v) is 0.450 mm (which corresponds to a cross-sectional area of 0.16 mm²), each manifold channel segment (44) has an initial cross-sectional area of 0.450×0.25=0.11 mm² and provides fluid flow to/from microchannels (54) having a cross-sectional area of 0.09 mm².

It is to be appreciated that recessed regions (R) to which the manifold channels (C) are aligned also provide additional cross-sectional area for fluid flow. This additional area is provided to reduce the pressure drop caused by the changing direction of the fluid flow as well as the changing geometry of the channel. The microchannels will have more wet perimeter per unit of area than the feeding via (v) and, consequently, there will be an increased pressure drop. The additional volume interconnecting these two structures will allow the fluid flow to find a path of low resistance away from the walls. With a smaller volume, the pressure drop penalty will increase due to the wall friction. As described above, the cross-sectional area of the fluid via (v), the initial cross-sectional area of each manifold channel segment, and the total cross-sectional area of the microchannels to which fluid is provided to or from are all within 25% of their average value.

As noted above, an integrated microchannel cooler device can be formed with the exemplary manifold plate (40) and microchannel plate (50) by bonding the surface (S2) of the manifold plate (40) to the microchannel plate (50) such that the manifold channels (Ci) are aligned with and face the corresponding recessed regions (Ri). More specifically, an integrated microchannel cooler device having an overall size of 20×20 mm with six heat exchanger zones formed between alternating input and output manifolds, as indicated by "I" and "O" in FIG. 4C, and having the manifold/microfin/microchannel dimensions set forth and discussed above, can be constructed using the exemplary plates (40) and (50). Exemplary methods for forming integrated cooler devices and packaging such devices with IC chips will be further explained below with reference to FIGS. 7 and 8, for example.

It is to be appreciated that integrated microchannel cooler devices according to exemplary embodiments of the invention provide efficient and low operating pressure microchannel cooler frameworks which enable effective cooling for electronic devices having very high power densities, and which can be readily manufactured and integrated with the chip packaging, for example. More specifically, various exemplary embodiments of an integrated microchannel cooler devices according to the invention are designed with fluid manifolds, microfins and microchannels that are structured, patterned, dimensioned and/or arranged in a manner, for example, to provide (i) a uniform distribution and flow of coolant fluid and an overall reduction in the system pressure drop, (ii) an increase in manufacturing yields when fabricating a cooler device; and (iii) ease of integration with chip packaging.

More specifically, by way of example, with respect to ease of integration with chip packaging, the use of fluid vias on the back surface of the manifold chip to input/output coolant fluid to/from the integrated microchannel cooler device enables the microchannel cooler device to be dimensioned such that is does not extend significantly beyond the area of the chip being cooled. This is especially advantageous for MCMs, where chips are mounted very close to each other. Moreover, as explained further below, by forming the microfin/microchannel structures in a separate layer (as opposed to forming such structures in the non-active surface of the chip to be cooled), an individual microchannel cooler device can be first constructed and tested, and then thermally bonded to the chips in a manner that enables any yield loss during the cooler fabrication not to result in yield loss of the assembled chip and integrated cooler.

Moreover, with respect to increasing manufacturing yield, the fluid manifolds are designed/structured in such as way as to maintain the structural integrity of the substrate in which the manifolds are formed and minimize the potential of breakage of the substrate. Indeed, as explained with reference to the exemplary manifold plate (40), the manifolds (Mi) are not formed with continuous elongated slots for providing the coolant flow (as in conventional designs), but rather with a series of circular openings, or openings with rounded corners, arranged in a zig-zag pattern, to reduce wafer cracking during manufacturing, and with manifold channels formed between the circular openings on the plate surface that faces the microchannels. These manifold structures reduce the potential of wafer breakage by using circular openings to minimize stress concentrations which can serve as crack nucleation sites, minimizing the total cavity area of the channel manifolds by using the recessed regions of the microchannel pattern to act as a manifold in conjunction with the manifold channels, and avoid aligning the cavities along the (100) Si cleavage planes.

Furthermore, integrated microchannel cooler devices according to exemplary embodiments of the invention may implement various mechanisms for achieving uniformity of the distribution and flow of coolant fluid and an overall reduction in the system pressure drop. For instance, one method that is implemented for reducing the pressure drop is subdividing the coolant flow into multiple heat exchanger zones so that the flow paths through the microchannels are short. More specifically, by way of example, the exemplary manifold and microchannel plate embodiments discussed above, provide multiple input and output fluid manifolds (Mi) for defining multiple heat exchanger zones. Indeed, as depicted in the exemplary microchannel plate (50) of FIG. 5A and manifold plate (40) in FIG. 4C, six heat exchanger zones are defined by alternating input and output manifolds, wherein each input manifold (M2, M4 and M6) feeds two zones of microchannels that end at output manifolds (M1, M3, M5 and M7). Further, the zig-zag manifold structures enable the formation of multiple manifolds while maintaining the structural integrity of the chip.

Another method for reducing pressure drop is to design the manifolds such that each manifold channel has an initial, or final, cross-sectional area that is at least equal to a total cross-sectional area of all microchannels that receive coolant fluid from the manifold channel, or that supply coolant fluid to the manifold channel. For instance, in the exemplary embodiments of FIGS. 4C and FIG. 5A, the input manifold channels C2, C4 and C6 each feed two zones of microchannels. As such, the initial cross-sectional area of each of the input manifold channels should be at least as large as the sum of the microchannel cross-sections that are fed by such channels. Moreover, the output manifold channels C3 and C5 each received coolant fluid from 2 zones of microchannels. As such, the final cross-sectional area of output manifold channels C3 and C5 should be at least as large as the sum of the microchannel cross-sections that feed such manifold channels (or, in the exemplary embodiment, the cross-sectional area of each manifold channel C2~C6 should be the same). On the other hand, the output manifold channels C1 and C7 are each fed by one zone of microchannels. As such, the final cross-sectional area of each output manifold channel C1 and C7 should be no less than one-half the initial cross-sectional area of the input manifold channels (M2 and M6).

Similarly, another method for reducing pressure drop is to design the manifolds such that the fluid vias for each manifold have a total cross-sectional area that is at least equal to the total cross-sectional area of all microchannels that receive coolant fluid supplied through the fluid vias or that supply coolant fluid which is output from the fluid vias. For instance, the fluid vias for via pattern V4 should have a total cross-sectional area at least equal to the sum of the cross-sectional area of the microchannels that are fed by the corresponding manifold channel C4.

Moreover, as noted above, another manifold design feature for reducing pressure drop is to vary the cross-sectional area of the manifold channels to uniformly feed coolant fluid to the microchannels. For instance, as depicted in the exemplary embodiments of FIGS. 5B and 6, the channel segments (44) between the input fluid vias (v) of manifold channel (C2) and corresponding portions of the recessed regions (R2) are tapered down away from input fluid vias (v), to as to reduce the cross-sectional area along the coolant path. This results in reduced pressure drop and maintaining the velocity of fluid flow constant, so as to uniformly feed coolant into the microchannels that are disposed along the channel segments. Moreover, the pressure drop can be further reduced by rounding or tapering the microchannel inlet corners which reduces the flow resistance by smoothing the incoming flow.

Overall, an integrated microchannel cooler device according to the invention, which is formed from the exemplary manifold and microchannel plates (40) and (50), provides a multi-heat exchanger zone structure in which all the heat exchanger zones are connected in parallel, which means that the heat exchanger zones are uniformly designed (e.g., the microchannel pattern is the same (continues channels with same pitch) in all heat exchanger zones, and the alternating input and output manifolds are equally spaced so that microchannel lengths are substantially the same for all heat exchanger zones) to operate with the same pressure drop between the inlet and outlet manifolds, and the manifolds are designed with variable cross-sectional areas so as to ensure that for a given heat exchanger zone, there is a uniform distribution of coolant across the heat exchanger zone. In this manner, the integrated microchannel cooler can be designed with a sufficient number of parallel heat exchanger zones and flow pressures based on an expected average power density of a chip, to provide a flow per unit width and pressure drop per unit length that is sufficient to effectively cool the chip with such average power density.

Figure 7:
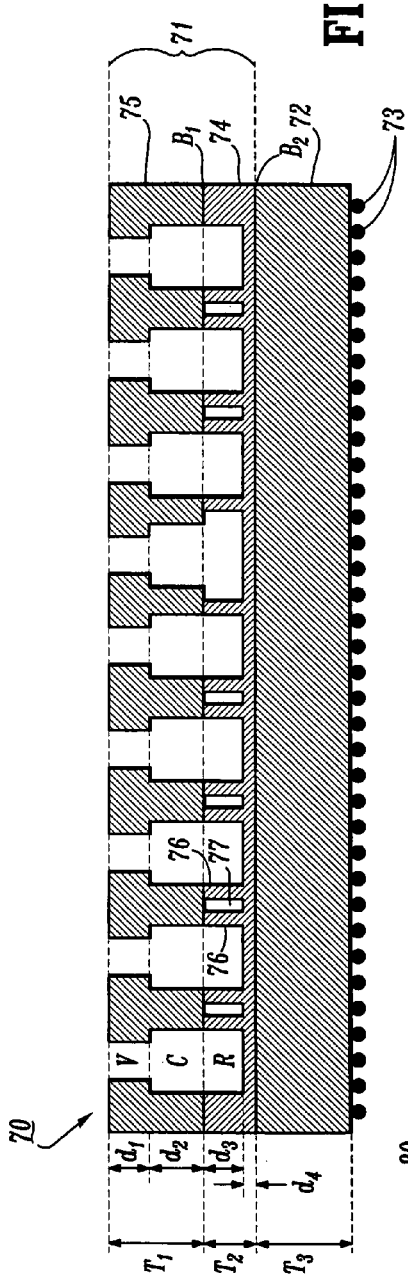
FIG. 7 is a schematic cross-sectional diagram illustrating an apparatus for microchannel cooling a semiconductor chip according to an exemplary embodiment of the invention.

FIG. 7 is a schematic diagram of an apparatus for cooling an a semiconductor chip according to an exemplary embodiment of the invention. More specifically, FIG. 7 schematically illustrates a cross-sectional side-view of a semiconductor package (70) according to an exemplary embodiment of the invention, which comprises an integrated microchannel cooler device (71) that is thermally coupled to the back (non-active) surface of a semiconductor chip (72) (e.g., processor chip) via a thermal bond (B2). The active surface of the chip (72) comprises a plurality of solder balls (C4s) for flip-chip bonding to a package substrate.

The microchannel cooler device (71) comprises a microchannel plate (74) and manifold plate (75) that are joined via a bond (B1), and the plates (74) and (75) can have manifold and microchannel structures similar to those discussed above with respect to FIGS. 4A–4D and 5A–5B. In this regard, the exemplary embodiment of FIG. 7 may be considered a cross-sectional view along a longitudinal line which: (i) extends in a direction parallel to a zig-zag shaped fluid manifold structure formed in the manifold plate (75) and orthogonal to a plurality of thermal microfins (76) and microchannels (77) of the microchannel plate (74); and which (ii) passes through the center of each of a plurality of fluid vias (v) formed on one side of the zig-zag shaped fluid manifold structure. As depicted in FIG. 7, the fluid vias (v) form openings at points along the manifold channel (C), and the microchannel plate (74) comprises a plurality of regions (R) in which the thermal microfins (76) are discontinued. The plurality of thermal microfins (76) and channels (77) extend in parallel in a direction orthogonal to the plane of the drawing sheet.

The bond (B1) between the manifold plate (75) and the microchannel plate (74) is sufficient to provide a watertight seal, but the bond (B1) does not have to provide a low thermal resistance. Accordingly, bonding methods such as direct wafer bonding, fusion bonding, anodic bonding, glass frit bonding, solder bonding, polymer adhesive bonding, or any other suitable bonding method may be used to join the microchannel and manifold plates (74) and (75). Moreover, the bond (B2) between the microchannel plate (74) and the chip (72) should be formed using a low thermal resistance bond, to thereby allow sufficient heat conduction from the chip (72) to the microchannel plate (74). A low thermal resistance bond such as a metal joint, solder joint, or a filled thermal adhesive such as a Ag epoxy, or other joining means could be used, as long as the bonding thickness is sufficiently thin and compatible with the level of cooling flux required. It is desirable that the thermal resistance of the low thermal resistance bond be less than 0.2 C-cm$^2$/W, or preferably, less than or equal to 0.1 C-cm$^2$/W. Further, it is desirable that the bond (B2) be reworkable, so that the microchannel cooler (71) can be removed from the chip (72), when necessary, to either replace the individual cooler device (71) or replace the chip (72). Accordingly, a solder join can be reworked and if a solder layer is in contact with an Ag epoxy joint, it can also be reworked.

The dimensions of the manifold plate (75), such as thickness $T_1$, and the dimensions of the manifold structures, such as the depth $d_1$ of the fluid vias (v) and the depth $d_2$ of the manifold channels (C), can be the same as those described above with respect to FIG. 4D. Moreover, recess depth $d_3$ of the microchannels (77) can be the same as described above with respect to FIG. 5A~B. However, in another exemplary embodiment of the invention, the thickness $T_2$ of the microchannel plate (74) can be reduced (from the typical silicon wafer thickness of 0.75 mm) using various methods to minimize the distance $d_4$ to reduce the temperature drop through the silicon thickness, thereby increasing thermal performance of the package (70). For instance, in one embodiment, the thickness $T_2$ can be reduced from the typical thickness of 0.75 mm for a 200 or 300 mm diameter silicon wafer such that the distance $d_4$ is about 100 micron.

Various methods may be employed for constructing the package structure (70) of FIG. 7. In general, in one embodiment of the invention, the microchannel plate (74) and the manifold chip (75) can be bonded to each other and tested, and then thermally bonded to the back of the chip (72) with the microchannel plate (74) in contact with the back surface of the chip (72). More specifically, in one exemplary embodiment of the invention, at the wafer level, a first wafer comprising a plurality of microchannel plates formed therein can be bonded to a second wafer containing a plurality of corresponding manifold plates. The bonded wafers can then be subjected to polishing, grinding, and/or lapping to thin down the substrate on which the microchannel plates are fabricated. Alternatively, the wafer containing the plurality of microchannel plates can first be thinned prior to bonding or dicing. With the two wafers bonded together, the wafers can be diced to separate out the individual microchannel cooler devices. Alternately, the wafers containing the microchannel and manifold plates can be polished, diced, etc., and then individual microchannel cooler devices can be formed by bonding the individual manifold and microchannel plates. Note that outside dimensions of microchannel cooler (71) in FIG. 7 can be slightly greater than the outside dimensions of chip (72) so that microchannel cooler (71) extends beyond chip (72) slight on each side. Such a slight extension can improve the performance because the perimeter region where manifold plate (75) and microchannel plate (74) are joined together provide reduced cooling compared to the interior regions of microchannel cooler (71). The slight extension allows the entire back surface of chip (72) to be in contact with the interior regions of microchannel cooler (71) which contain microchannels.

In another exemplary embodiment of the invention, the thermal performance of the package structure (70) of FIG. 7 can be further improved by thinning the substrate of the chip (72), in addition to reducing the thickness of the substrate material remaining beneath the microchannels (77) in the microchannel plate (74). For example, as noted above, the surface of the microchannel plate (74) which is bonded to the chip (72) can be polished to have only about 100 micron of Si present below the deepest etched regions on the microchannel plate. Further, the thickness $T_3$ of the chip (72), e.g., processor chip, may be reduced to about 0.3 mm from an initial Si wafer thickness of about 0.75 mm.

The exemplary microchannel cooler device embodiments described above, such as in FIG. 7, include integrated microchannel cooler devices that are formed by joining separate manifold and microchannel plates. In other embodiments of the invention, an integrated microchannel cooler device comprises a single plate that is constructed with both microchannels and supply/return manifolds structures. For example, FIGS. 8A and 8B are schematic diagrams illustrating an apparatus (80) for cooling a semiconductor chip according to another exemplary embodiment of the invention, which includes an integrated microchannel cooler (81) that is thermally bonded to the non-active surface of a semiconductor chip (82) which can be flip-chip bonded to a package substrate via solder balls (83).

Figure 8A:
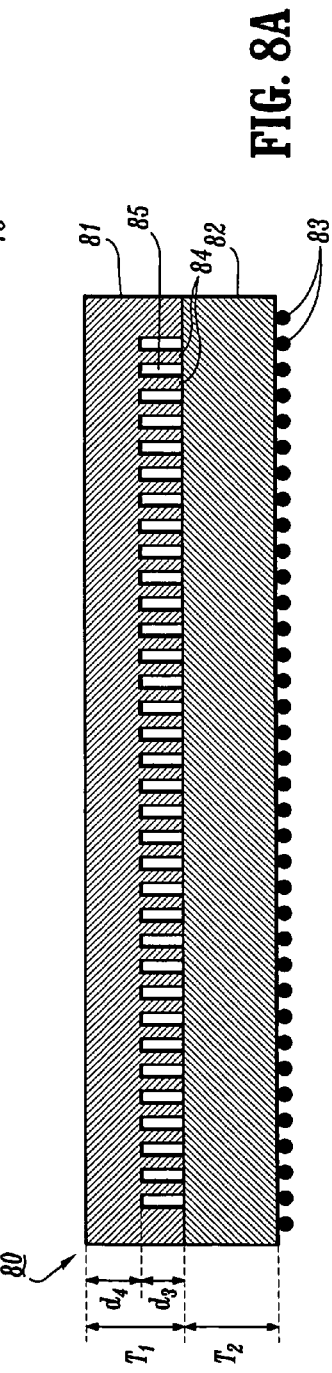
FIGS. 8A~8B are schematic cross-sectional diagrams illustrating an apparatus for microchannel cooling a semiconductor chip according to another exemplary embodiment of the invention.

More specifically, FIG. 8A schematically illustrates a cross-sectional view of an IC package structure (80) taken along a longitudinal line which extends in a direction orthogonal to a plurality of thermal microfins (84) and microchannels (85) in a heat exchanger zone of the cooler (81). Further, FIG. 8B schematically illustrates a cross-sectional view along a longitudinal line which (i) extends in a direction parallel to a zig-zag shaped fluid manifold structure formed at an end portion of the heat exchanger zone in the integrated cooler (81), and which (ii) passes through the center of each of a plurality of fluid vias (v) formed on one side of the zig-zag shaped fluid manifold structure.

Figure 8B:
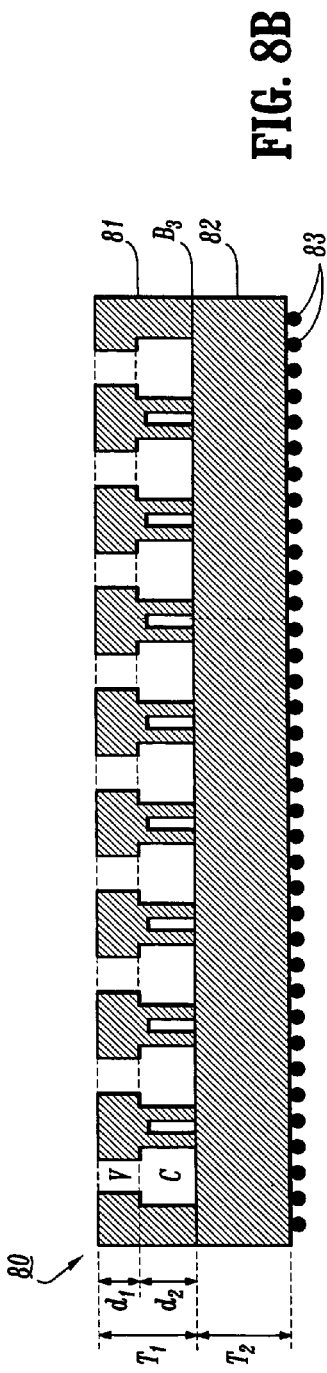

In other words, the integrated microchannel cooler device (81) framework depicted in FIGS. 8A and 8B, combines the functions and structures of the microchannel plate and the manifold plate in one substrate layer. The exemplary microchannel cooler device (81) can be formed by etching the via patterns as discussed above to form the fluid vias (v) to a depth $d_1$ on one surface of the cooler substrate (81). Then, one or more dry etching steps could be used to form the manifold channels (C) and the thermal microfins (84) and microchannels (85). If the manifold channels (C) are formed to have the same depth as the microchannels (85), i.e., $d_2=d_3$, the manifold channels (C) and microchannels (85) can be formed with the same dry etching step. Alternately, the manifold channels and microchannels could be formed by two separate and independent dry etch steps or a combination of two dry etch steps.

In the exemplary embodiment of FIGS. 8A and 8B, the manifold channels (C) are depicted as being deeper than the microchannels (85) ($d_2>d_3$). In such embodiment, two dry etch steps can be used to form deeper manifold channels (C) (which are deeper than the microchannels (85) by more than that which would result from RIE lag—wider features etch faster than narrower features). With this configuration, the fabrication process can be simpler and the performance can potentially be improved due to the direct contact of the cooling fluid to the chip (82). Moreover, the thermal microfins (84) fins are joined to the chip (82) using a low thermal resistant bond (B3). It is to be noted that with this design, the interior region of the microchannel cooler device (81) containing microchannels is smaller than the chip (82), because a perimeter region is needed to seal the two together. Note that a hermetic bonding method is needed in the perimeter region to form the seal.

Figure 9B:
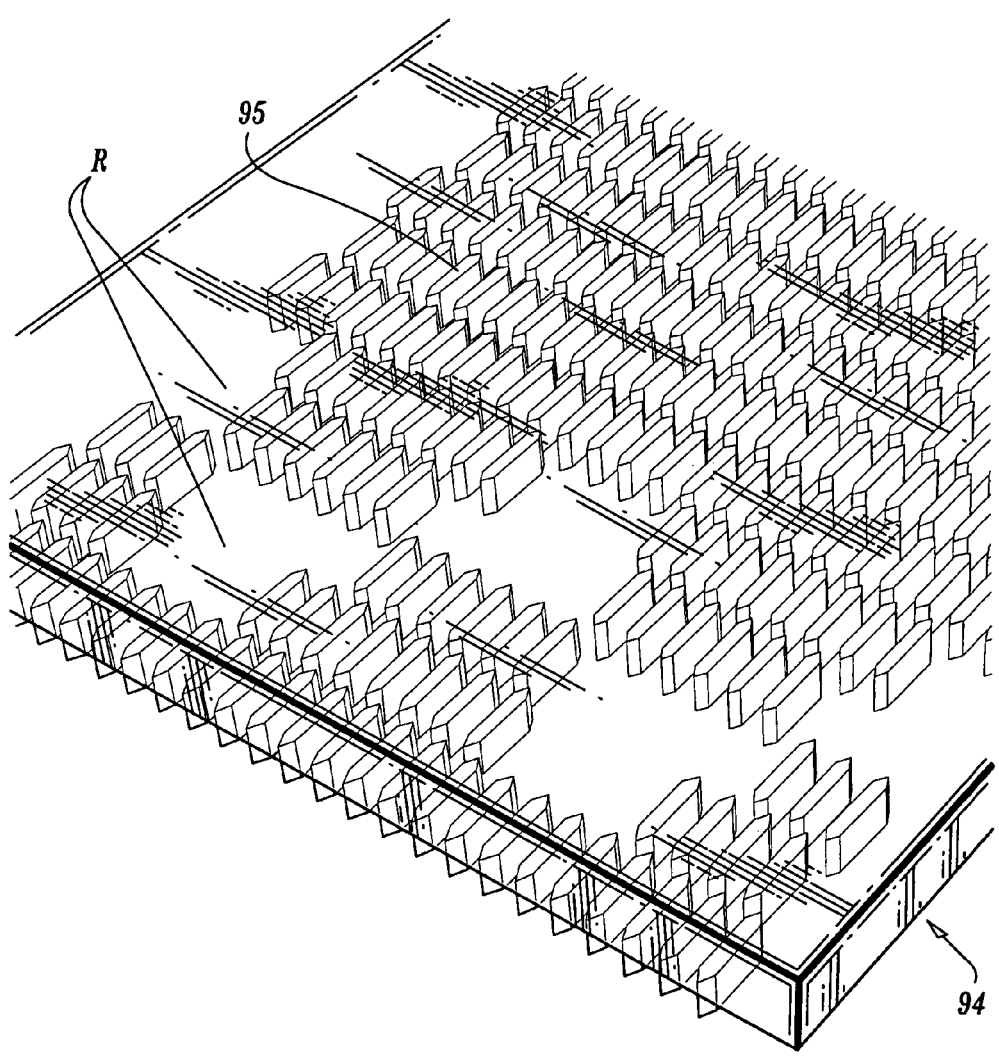
Figure 9C:
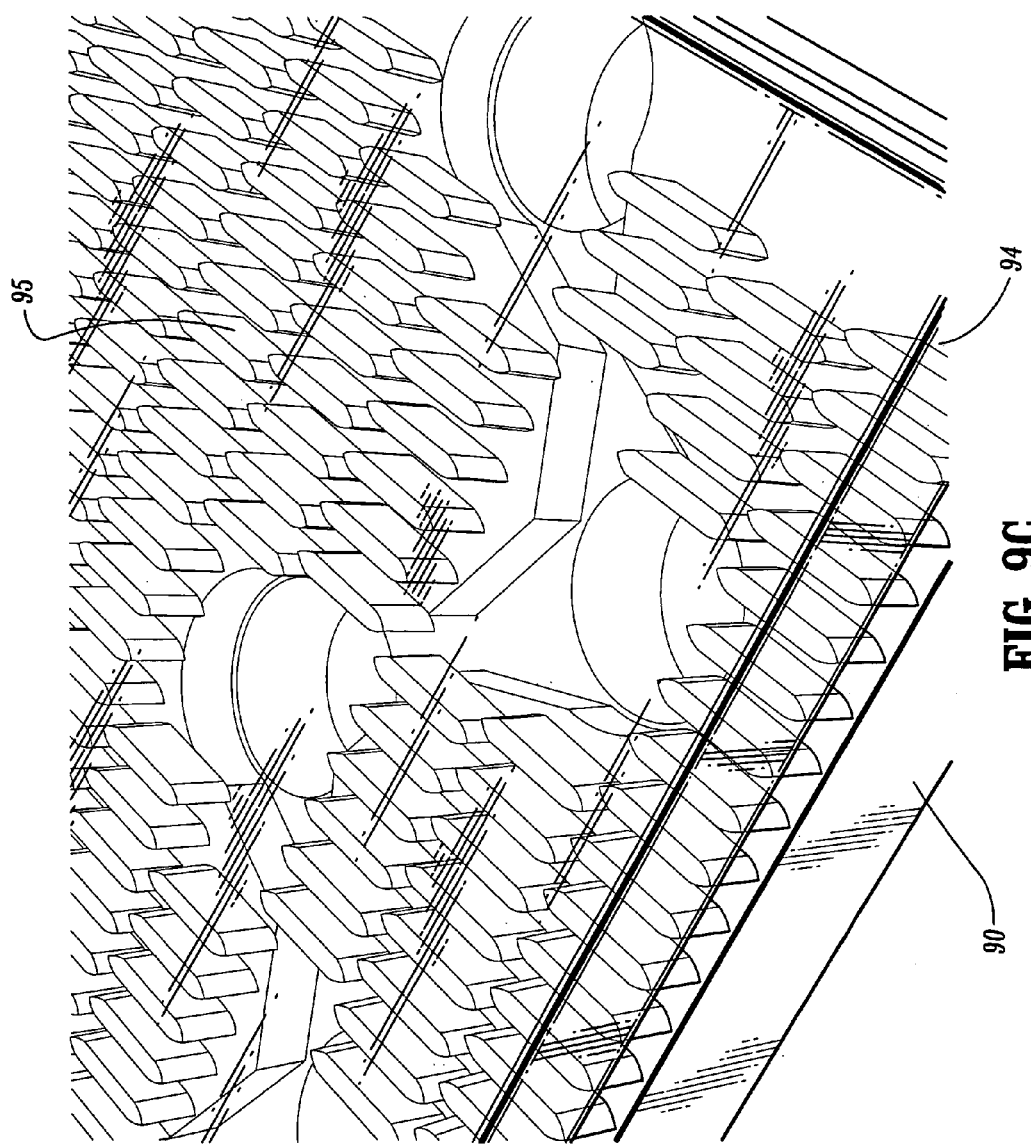

FIGS. 9A–9C are schematic perspective views of an integrated microchannel cooler device according to another exemplary embodiment of the invention. More specifically, as described above, FIG. 9A depicts a three-dimensional perspective view of a portion of manifold plate (90) having a fluid manifold (91), which comprises a manifold channel (92) formed in a zig-zag pattern and a plurality of fluid vias (v) that form openings to the manifold channel (92). The channel segments (93) of the manifold channel (92) formed between the fluid vias (v) are tapered.

FIG. 9B depicts a three-dimensional perspective view of a portion of a microchannel plate (94), which can be bonded to the manifold plate (90) of FIG. 9A to form an integrated microchannel cooler apparatus as depicted in FIG. 9C. FIG. 9B is a perspective view of the microchannel plate (94) as viewed from the top where for clarity, the substrate is shown as semitransparent solid, illustrating a plurality of thermal microfins (95) formed on a bottom surface of the substrate in a staggered pattern. As compared to the exemplary embodiments above wherein the microchannels are continuous in each heat exchanger zone between manifolds, the staggered microfin pattern depicted in FIG. 9B can be used to increase the heat transfer (compared to continuous fins) by having each fin segment shed the boundary layer, so a new boundary layer is formed for each fin segment. This design also allows transverse mixing (between channels); such a structure helps prevent catastrophic failure due to channel clogging and provides an additional mechanism to improve flow uniformity within the microfin region.

FIG. 9C is depicts a perspective view of a portion of an integrated microchannel cooler module that is formed by bonding the manifold plate (90) of FIG. 9A and the microchannel plate (94) of FIG. 9B. In particular, FIG. 9C is a perspective view as viewed from the top surface of the microchannel plate substrate (94), which is shown as semitransparent solid for illustrative purposes, wherein the thermal microfins (95) pattern is discontinued in the regions R that are aligned along the manifold channel (92).

In other exemplary embodiments of the invention, microchannel cooling apparatus include fluid distribution manifolds for SCM and MCM packages, which are connected to separate integrated microchannel cooler devices that are bonded to the back surfaces of chips that are flip-chip bonded to a substrate, for delivering coolant fluid to/from integrated microchannel cooler devices. High performance chips, e.g., processors, are typically mounted face down to a packaging substrate, made from a ceramic or organic material and containing multiple wiring layers, using an area array of microsolder balls such as C4's. In a multichip module (MCM), many chips are mounted on a common substrate and with a single chip module (SCM) only one chip is attached to the substrate. The ceramic substrate provides a space transformation between the fine pitch (~200 micron) C4s and the more coarse pitch electrical connections between the $1^{st}$ level package substrate and the printed circuit board, or $2^{nd}$ level package, which are about 1 mm apart. One common means of providing electrical connection between a $1^{st}$ and a $2^{nd}$ level package is a land grid array (LGA) which requires a significant compression force to be applied to actuate the LGA.

Figure 10:
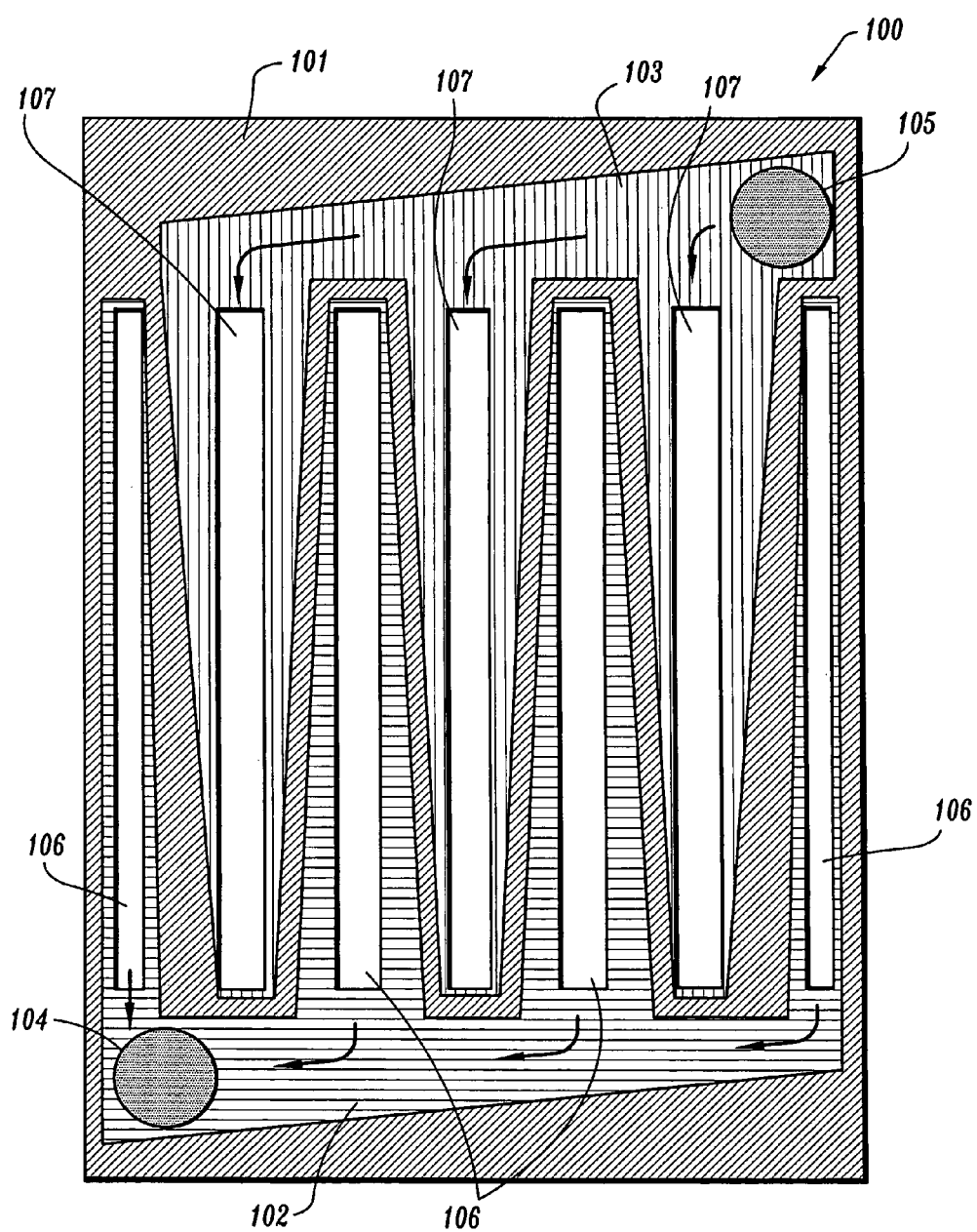
FIG. 10 is a schematic plan view of a fluid distribution manifold device according to an exemplary embodiment of the invention.
Figure 11:
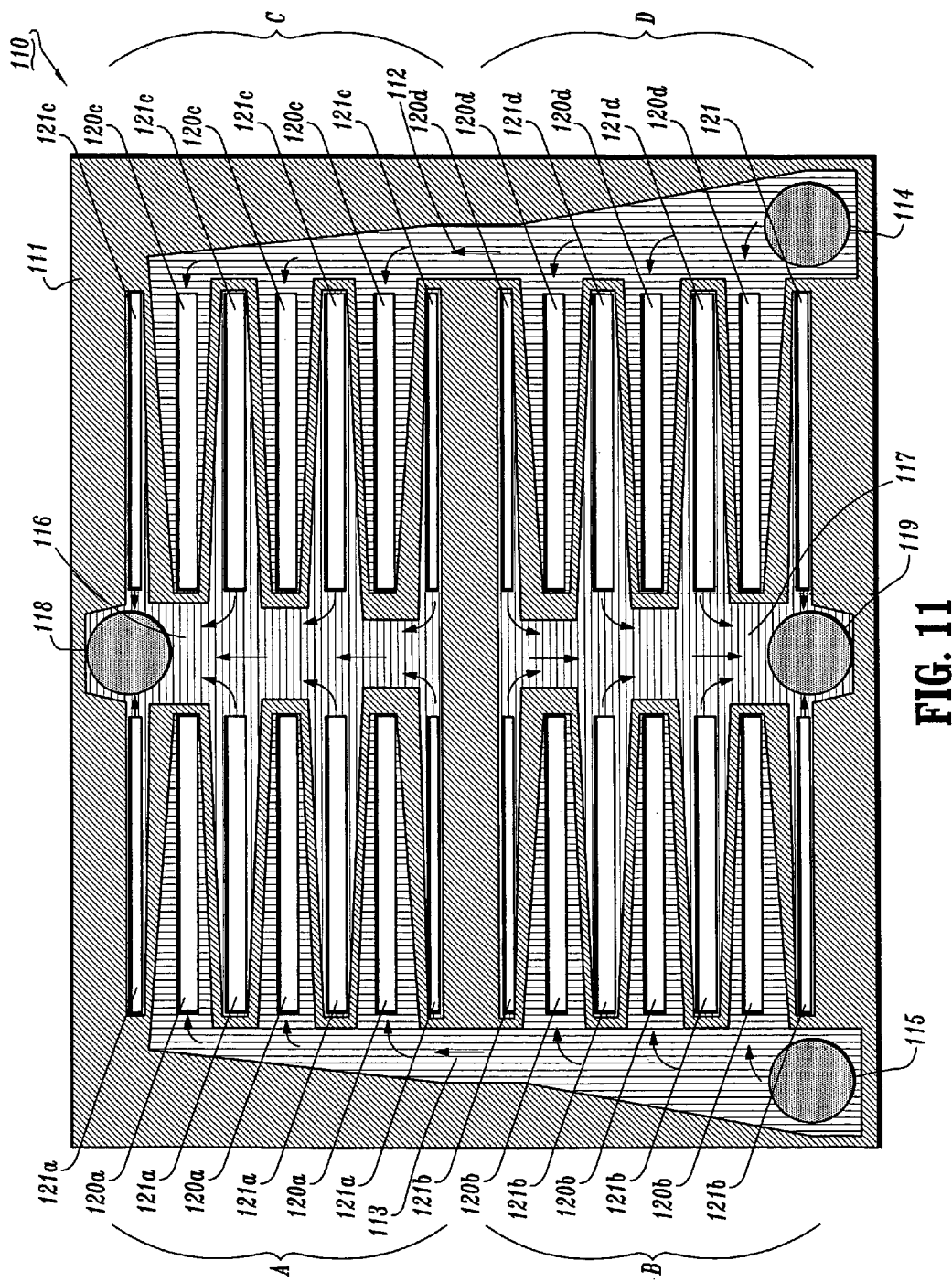
FIG. 11 is a schematic plan view of a fluid distribution manifold device according to another exemplary embodiment of the invention.

FIGS. 10 and 11 are schematic diagrams illustrating fluid distribution manifolds according to exemplary embodiments of the invention, which can be implemented for SCM and MCM chip packages. The exemplary fluid distribution manifolds are designed in a manner to minimize overall system pressure drop by using variable cross-sectional fluid supply/return channels for delivering coolant fluid to/from integrated microchannel cooler devices. Moreover, exemplary embodiments of the invention implement connection mechanisms that provide mechanical decoupling between the fluid distribution manifolds and the integrated microchannel cooler devices to prevent excess stress on the C4's which attach the chips to the package substrate. More specifically, for purposes of providing mechanical compliance when a fluid distribution manifold is secured to a microchannel cooler, a mechanically compliant gasket/seal is provided between the fluid distribution manifold and a microchannel cooler to seal the junction between such components. The mechanically compliant gasket comprises any suitable compressible material, such as elastomer, or any other suitable material that can be compress when coupling the coolant deliver manifold to the microchannel structure may be securely made while tolerating differences in height of the integrated circuit chips, and without requiring large pressures which can damage the chips. The compliant gasket material may also be adhered or bonded to the microchannel cooler and the fluid distribution manifold so that it need not be maintained in a compressed state to form a fluid seal.

By way of example, FIG. 10 is a schematic plan view of a fluid distribution manifold device according to an exemplary embodiment of the invention, which can be used with an integrated microchannel cooler device formed with the above-described exemplary manifold plate (40) for a single chip module (SCM). More specifically, FIG. 10 illustrates an exemplary fluid distribution manifold (100) comprising a housing (101) having a fluid return manifold (102) and fluid supply manifold (103) cut or formed therein. The fluid return manifold (102) comprises a plurality of flow channels indicated by the horizontal cross-hatched regions, and the fluid supply manifold (103) comprises a plurality of flow channels indicated by the vertical cross-hatched regions. Further, circular regions (104) and (105) indicate where output and input ports would be made in a cover plate (not shown) secured to the housing (101) to provide the fluid supply/return connections to the fluid distribution manifold (100).

The manifold (100) includes a plurality of elongated rectangular openings (106) and (107) on the bottom surface of the housing (101), which are coupled to fluid vias (v) of corresponding manifolds (Mi) on the manifold plate (40) in FIG. 4C with a mechanically compliant gasket. For example, in the exemplary embodiment, the rectangular openings (107) are aligned with and coupled to the fluid vias of the input manifolds M2, M4, and M6 to supply coolant fluid into the microchannel cooler device and the rectangular openings (106) are aligned with and coupled to the fluid vias of the output manifolds M1, M3, M5 and M7 for receiving heated fluid that is returned from the microchannel cooler device.

Moreover, as depicted in FIG. 10, the manifolds (102) and (103) are formed with variable cross section channels to maintain the velocity of the fluid flow near constant and reduce dynamic pressure drop. For instance, the cross-sectional area of the flow channel of the supply manifold (103) that is aligned with the inlet port (105) is tapered to provide uniform distribution of the input coolant fluid to each of the flow channels which feed the rectangular openings (107). Further, the flow channels which feed the rectangular openings (107) are also tapered to reduce the cross-section area to uniformly supply coolant fluid to the input fluid vias along the input manifolds of the integrated microchannel cooler connected thereto. Similarly, the various flow channels that form the return manifold (102) are designed with variable cross-sectional area to reduce dynamic pressure drops for the return fluid received from the output manifolds of the integrated microchannel cooler attached thereto. For instance, the cross-sectional area of the flow channel of the supply manifold (102) that is aligned with the output port (105) is tapered to provide uniform redistribution of the output coolant fluid that flows from each flow channel having the rectangular openings (106). Moreover, the flow channels which receive return fluid from the rectangular openings (106) are also tapered to reduce the cross-section area to provide a uniform flow and redistribution of coolant fluid that is received from the outlet fluid vias along the output manifolds of the integrated microchannel cooler connected thereto.

It is to be appreciated that the cross-sectional areas of the supply/return manifold segments can also be varied by varying the recess depths of such segments, in addition to or in lieu of, varying the channel widths such as shown in FIG. 10. In all instances, the area of the flow channels are decreased sufficiently to reduce the dynamic pressure drop by maintaining the velocity of the coolant fluid substantially, or very close to, constant along the flow channels in the fluid distribution manifold device (100). Moreover, although not specifically shown, a further reduction ins pressure drop can be obtained by rounding the corners of the flow channels of the input and output manifolds (102) and (103) to reduce the resistance to flow.

The fluid distribution manifold can be formed of any suitable corrosion resistant material, such as copper or plastic or other material, in which the flow channels of the input and output manifolds can be milled, drilled, molded, or otherwise formed in a block of such material. The fluid distribution manifold (100) should be of sufficient dimensions with larger variable cross-sections to properly feed inlet and outlet manifolds of the integrated microchannels cooler device connected thereto. This particular larger variable cross-section manifold can not be machined into the manifold plate, mainly because of geometrical constraints which require the additional cross-section area to be -formed with higher vertical dimensions, which can not be achieved using a thin plate such as a silicon wafer.

FIG. 11 is a schematic plan view of a fluid distribution manifold device according to another exemplary embodiment of the invention. In particular, FIG. 11 depicts a common fluid distribution manifold (110) which can be implemented with a multi-chip module (MCM) that comprises an array of four flip-chip bonded chips, wherein each chip has a separate integrated microchannel cooler device attached thereto, which is formed with the exemplary manifold plate (40) as depicted in FIG. 4C. The exemplary fluid distribution manifold (110) comprises a housing (111) having two fluid supply manifolds (112) and (113), which are supplied with coolant fluid from respective inlets (114) and (115) formed in a cover plate (not shown), as well as two fluid return manifolds (116) and (117), which output fluid to respective outlet ports (118) and (119) formed in the manifold cover. The exemplary fluid distribution manifold (110) comprises four manifold sections (A, B, C and D), which are similar in structure to the fluid distribution manifold structure (100) of FIG. 10.

The fluid supply manifolds (112) and (113) comprise a plurality of flow channels indicated by the vertical cross-hatched areas, which are cut or formed in the housing (111). The fluid supply manifold (113) supplies coolant fluid to 2 integrated microchannel coolers connected to manifold sections A and B and the fluid supply manifold (112) supplies coolant fluid to 2 integrated microchannel coolers connected to manifold sections C and D. More specifically, the fluid supply manifold (113) comprises flow channel regions having a plurality of rectangular openings (120a) that are aligned with the fluid vias of corresponding input manifolds of a first microchannel cooler device coupled to the manifold section A, as well as flow channel regions having a plurality of rectangular openings (120b) that are aligned with the fluid vias of corresponding input manifolds of second microchannel cooler device coupled to the manifold section B. Similarly, the fluid supply manifold (112) comprises flow channel regions having a plurality of rectangular openings (120c) that are aligned with the fluid vias of corresponding input manifolds of a third microchannel cooler device coupled to the manifold section C, as well as flow channel regions having a plurality of rectangular openings (120d) that are aligned with the fluid vias of corresponding input manifolds of a fourth microchannel cooler device coupled to the manifold section D.

The fluid return manifolds (116) and (117) comprise a plurality of flow channels indicated by the horizontal cross-hatched areas, which are cut or formed in the housing (111). The fluid return manifold (116) receives coolant fluid returned from 2 integrated microchannel coolers connected to manifold sections A and C and the fluid return manifold (117) receives coolant fluid returned from two integrated microchannel coolers connected to manifold sections B and D. More specifically, the fluid return manifold (116) comprises flow channel regions having a plurality of rectangular openings (121a) that are aligned with the fluid vias of corresponding output manifolds of the first microchannel cooler device coupled to the manifold section A, as well as flow channel regions having a plurality of rectangular openings (121c) that are aligned with the fluid vias of corresponding output manifolds of the third microchannel cooler device coupled to the manifold section C. Similarly, the fluid return manifold (117) comprises flow channel regions having a plurality of rectangular openings (121b) that are aligned with the fluid vias of corresponding output manifolds of the second microchannel cooler device coupled to the manifold section B, as well as flow channel regions having a plurality of rectangular openings (121d) that are aligned with the fluid vias of corresponding output manifolds of the fourth microchannel cooler device coupled to the manifold section D.

Therefore, as described above, a fluid distribution system according to an exemplary embodiment of the invention, which can be used for implementing a microchannel cooling apparatus, comprises a fluid distribution manifold block (e.g., 100 or 110) coupled with a compliant gasket to a manifold plate (e.g., manifold plate (40)) of one or more microchannel cooler devices, where at least the distribution manifold block and the manifold plate have variable cross-sections (i.e. tapered) flow channels. The compliant gasket may or may not contain variable cross-section flow channels.

Although exemplary embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An apparatus for cooling an electronic device, comprising:
   a manifold plate comprising a plurality of alternating input and output manifolds that extend in a same direction along the manifold plate, wherein at least one heat exchanger zone is defined between each adjacent input and output manifold, and wherein one or more of the manifolds extends in a zig-zag pattern, wherein each manifold comprises a manifold channel formed in a first surface of the manifold plate, and a plurality of vias that form openings in a second surface of the manifold plate opposite the first surface, which extend through the manifold plate to a plurality of locations along the manifold channel; and
   a microchannel plate comprising a pattern of microfins that define microchannels formed in a first surface of the microchannel plate, wherein the microchannels extend in a same direction along the microchannel plate,
   wherein the first surface of the manifold plate is coupled to the first surface of the microchannel plate such that the microchannels are positioned to provide fluid flow between adjacent manifolds.

2. The apparatus of claim 1, wherein the fluid vias have rounded corners or wherein the fluid vias are circular.

3. The apparatus of claim 1, wherein at least one manifold has a manifold channel with a variable cross-sectional area between the fluid vias along the length of the manifold channel.

4. The apparatus of claim 1, wherein for each of the one or more manifolds extending in a zig-zag pattern, the fluid vias are arranged in the zig-zag pattern, and the manifold channel comprises a plurality of channel segments arranged in the zig zag pattern, wherein each channel segment is formed between two fluid vias, and wherein each channel segment has a width that tapers down away from the two fluid vias along the channel segment.

5. The apparatus of claim 1, wherein each manifold channel has a cross-sectional area at any point along the channel that is within about 25% of, or more preferably at least approximately equal, to a total cross-sectional area of all microchannels that will receive coolant fluid from the manifold channel or that will supply coolant fluid to the manifold channel.

6. The apparatus of claim 1, wherein the fluid vias for each manifold have a total cross-sectional area that is within about 25% of, or more preferably at least approximately equal to, a total cross-sectional area of all microchannels that receive coolant fluid supplied through the fluid vias or that supply coolant fluid which is output from the fluid vias.

7. The apparatus of claim 1, wherein the microfin pattern of the microchannel plate comprises a plurality of recessed regions in which the microfin pattern is discontinued, wherein each recessed region is aligned to a corresponding manifold channel and comprises a pattern substantially similar to the corresponding manifold channel pattern.

8. The apparatus of claim 7, wherein end portions of the microfins adjacent the recessed regions are rounded or tapered.

9. The apparatus of claim 7, wherein the microfins between adjacent recessed regions define a plurality of microchannels that extend continuously between the adjacent recessed regions.

10. The apparatus of claim 7, wherein at least a portion of the microfins between adjacent recessed regions define a plurality of microchannels that extend in a staggered or interrupted pattern between the adjacent recessed regions.

11. The apparatus of claim 1, further comprising an IC (integrated circuit) chip having a non-active surface and an active surface, wherein the non-active surface of the IC chip is thermally bonded to a second surface of the microchannel plate, which is opposite the first surface of the microchannel plate, using a low thermal resistance bond with a thermal resistance below about 0.2 C-cm$^2$/W, or more preferably less than or equal to about 0.1 C-cm$^2$/W.

12. The apparatus of claim 11, wherein a thermal bonding material comprises one of solder, metal, silver filled epoxy, or a filled polymer material.

13. The apparatus of claim 11, wherein the micro channel plate is formed of silicon and wherein a thickness of the silicon between the second surface of the microchannel plate and a bottom of the microchannels is in a range of about 300 microns to about 100 microns.

14. The apparatus of claim 11, wherein a thickness of the IC chip is reduced below an original thickness to a thickness in a range of about 400 microns to about 250 microns.

15. The apparatus of claim 1, further comprising a fluid distribution manifold device, coupled to the second surface of the manifold plate, wherein the fluid distribution manifold device comprises:
  an inlet port for inputting coolant fluid into the fluid distribution device and an outlet port for outputting coolant fluid from the fluid distribution manifold device;
  an supply manifold comprising variable cross-section supply flow channels for supplying coolant fluid, which is input from the inlet port, to one or more manifolds of the microchannel plate; and
  a return manifold comprising variable cross-section return flow channels for returning coolant fluid to the outlet port which is returned from one or more manifolds of the microchannel plate.

16. The apparatus of claim 15, further comprising a compliant gasket that couples the fluid distribution manifold device to the second surface of the manifold plate.

17. The apparatus of claim 16, wherein the complaint gasket is bonded to the fluid distribution manifold device and manifold plate.

18. The apparatus of claim 15, wherein an average fluid velocity through the fluid distribution manifold block, manifold plate and microchannel plate varies in a range of less than about 25%.

19. An apparatus for cooling an electronic device, comprising:
  an integrated microchannel cooler device comprising a plurality of a plurality of alternating input and output manifolds and a plurality of microchannels formed in a single silicon substrate,
  wherein the plurality of manifolds extend in a same direction across a region of the silicon substrate, wherein at least one heat exchanger zone of microchannels is defined between each adjacent input and output manifold, wherein one or more of the manifolds extends in a zig-zag pattern, and wherein each manifold comprises a manifold channel formed in a first surface of the silicon substrate, and a plurality of vias that form openings in a second surface of the silicon substrate opposite the first surface, which extend through the silicon substrate to a plurality of locations along the manifold channel, and
  wherein the plurality of microchannels are defined by microfins that are formed in the first surface of the silicon substrate between adjacent manifolds, and wherein the microchannels are positioned to provide fluid flow between adjacent manifolds.

20. The apparatus of claim 19, wherein the fluid vias have rounded corners or wherein the fluid vias are circular.

21. The apparatus of claim 19, wherein at least one manifold has a manifold channel with a variable cross-sectional area between the fluid vias along the length of the manifold channel.

22. The apparatus of claim 19, wherein for each of the one or more manifolds extending in a zig-zag pattern, the fluid vias are arranged in the zig-zag pattern, and the manifold channel comprises a plurality of channel segments arranged in the zig zag pattern, wherein each channel segment is formed between two fluid vias, wherein each channel segment has a width that tapers down away from the two fluid vias along the channel segment.

23. The apparatus of claim 19, wherein each manifold channel has a cross-sectional area at any point along the channel that is within about 25% of, or more preferably, at least approximately equal to a total cross-sectional area of all microchannels that will receive coolant fluid from the manifold channel or that will supply coolant fluid to the manifold channel.

24. The apparatus of claim 19, further comprising an IC (integrated circuit) chip having a non-active surface and an active surface, wherein the non-active surface of the IC chip is hermetically bonded to the first surface of the silicon substrate using a low thermal resistance bond such as solder.

25. The apparatus of claim 19, further comprising a fluid distribution manifold device, coupled to the second surface of the silicon substrate of the integrated microchannel cooler device, wherein the fluid distribution manifold device comprises:
- an inlet port for inputting coolant fluid into the fluid distribution device and an outlet port for outputting coolant fluid from the fluid distribution manifold device;
- an supply manifold comprising variable cross-section supply flow channels for supplying coolant fluid, which is input from the inlet port, to one or more manifolds of the integrated microchannel cooler device; and
- a return manifold comprising variable cross-section return flow channels for returning coolant fluid to the outlet port which is returned from one or more manifolds of the integrated microchannel cooler device.

26. The apparatus of claim 25, further comprising a compliant gasket that couples the fluid distribution manifold device to the integrated microchannel cooler device, wherein the complaint gasket is either detachably coupled or bonded to the fluid distribution manifold device and the integrated microchannel cooler device.

27. An apparatus for cooling an electronic device, comprising:
- an integrated circuit (IC) chip comprising a non-active surface and an active surface, wherein the IC chip is flip-chip bonded to a package substrate;
- an integrated microchannel cooler device rigidly bonded with a low thermal resistance such as below about 0.2 $C\text{-}cm^2/W$, or more preferable less than or equal to about 0.1 $C\text{-}cm^2/W$, to the non-active surface of the IC chip; and
- a fluid distribution manifold device coupled to the integrated microchannel cooler device with a compliant gasket;
- wherein the integrated microchannel cooler device and fluid distribution manifold device each comprise a plurality of variable cross-section flow channels formed therein for providing uniform flow and distribution of coolant fluid that flows through the integrated microchannel cooler device and fluid distribution manifold device.

28. The apparatus of claim 27, wherein the plurality of variable cross-section flow channels formed in the integrated microchannel cooler device and fluid distribution manifold device cause coolant fluid to flow through the integrated microchannel device and fluid distribution manifold device with an average fluid velocity that is substantially constant.

29. The apparatus of claim 28, wherein the average fluid velocity that flows through the integrated microchannel device and fluid distribution manifold device varies no more than about 25%.

* * * * *